United States Patent [19]
Heller et al.

[11] Patent Number: 5,178,989
[45] Date of Patent: Jan. 12, 1993

[54] PATTERN FORMING AND TRANSFERRING PROCESSES

[75] Inventors: Adam Heller; Joseph C. Carls; Panagiotis Argitis; John J. Meaux, all of Austin, Tex.

[73] Assignee: Board of Regents, The University of Texas System

[21] Appl. No.: 384,705

[22] Filed: Jul. 21, 1989

[51] Int. Cl.$^5$ .......................... G03F 9/00; G03C 5/00
[52] U.S. Cl. .................................. 430/323; 430/324; 430/325; 430/428; 156/625; 156/643; 156/659.1; 156/660
[58] Field of Search ............... 430/428, 323, 324, 325, 430/5, 163; 361/502; 562/549; 156/625, 643, 659.1, 660

[56] References Cited

U.S. PATENT DOCUMENTS

| | | | |
|---|---|---|---|
| 3,285,746 | 11/1966 | Marks | 430/338 |
| 4,192,951 | 3/1980 | Slinkard et al. | 562/549 |
| 4,217,409 | 8/1980 | Inoue et al. | 430/346 |

(List continued on next page.)

FOREIGN PATENT DOCUMENTS

| | | |
|---|---|---|
| 0037179 | 10/1981 | European Pat. Off. |
| 0052787 | 6/1982 | European Pat. Off. |
| 0064565 | 11/1982 | European Pat. Off. |
| 0161660 | 11/1985 | European Pat. Off. |
| 0167854 | 1/1986 | European Pat. Off. |

(List continued on next page.)

OTHER PUBLICATIONS

Written Opinion for PCT/US 90/04123.
Wolter et al., "Isolation Layers on Base of Organic Modified Ceramics and Their Application".
International Search Report for PCT/US 90/04123.
Chem. Abstracts, 95:33478b (1981).
Chem Abstracts, 88:180329n (1978).
Chem Abstracts, 110:213626k (1989).
Abstract of JP 63-254,111 from Dialog Information Services, Inc.
Chem Abstracts, 110:231627m (1989).
Abstract of JP 63-254,112 from Dialog Information Services, Inc.
Abstract of JP 61-12,725 from Dialog Information Services, Inc.
Panasyuk, et al., "Photochemical Processes in Holographic Recording on Heteropolyacids", Fotochim. Protsessey Regist. Gologramm., V. A. Barachevski, Editor, Adad. Nauk. USSR, Fiz-Tech. Inst., Leningrad, USSR (1983).
Chalkley, "Experimental photographic Systems Based on Phosphotungstic Acid", Journal of the Optical Society of America, vol. 44, No. 9, pp. 699-709 (Sep. 1954).
Chem. Abstracts, 107:68340u (1987).
Kudo, et al., "Spin-Coatable Inorganic Resists Based on Novel Peroxopolyniobotungstic Acids for Bilayer Lithography", J. Electrochem. Soc.: Solid-State Science and Technology, vol. 134, No. 10, pp. 2607-2613 (Oct. 1987).
Okamoto, et al., "Peroxopolytungstic acids: A new inorganic resist material", Appl. Phys. Lett., vol. 49, pp. 298-300 (1986).
Fox, et al., "photoactivation of Metal Oxide Surfaces: Photocatalyzed Oxidation of Alcohols by Heteropoly-
(List continued on next page.)

Primary Examiner—Marion E. McCamish
Assistant Examiner—Kathleen Duda
Attorney, Agent, or Firm—Arnold, White & Durkee

[57] ABSTRACT

Pattern forming and transferring processes using radiation sensitive materials based upon mixtures of polyoxometalates and organic compounds. The processes involve establishing a layer of such radiation sensitve material on one or more layers of underlying materials. A pattern is formed in the layer of radiation sensitive material by exposing selected areas of the layer to radiation. The pattern may then be transferred into the underlying layers of material. Methods for developing patterns in layers of radiation sensitive materials, so as to hinder leaching of etch resistant substances included in the radiation sensitive materials, are also provided.

77 Claims, 5 Drawing Sheets

U.S PATENT DOCUMENTS

| | | | |
|---|---|---|---|
| 4,237,212 | 12/1980 | Inoue et al. | 430/428 |
| 4,596,759 | 6/1986 | Schupp et al. | 430/271 |
| 4,687,726 | 8/1987 | Schlögl et al. | 430/175 |
| 4,719,161 | 1/1988 | Kimura et al. | 430/5 |
| 4,772,533 | 9/1988 | Platzer et al. | 430/166 |

FOREIGN PATENT DOCUMENTS

| | | |
|---|---|---|
| 0184388 | 6/1986 | European Pat. Off. . |
| 0249941 | 12/1987 | European Pat. Off. . |
| 0330239 | 8/1989 | European Pat. Off. . |
| 0379301 | 7/1990 | European Pat. Off. . |
| 6112725 | 2/1961 | Japan . |
| 61272930 | 3/1961 | Japan . |
| 63254111 | 8/1968 | Japan . |
| 63254112 | 12/1968 | Japan . |
| 87/06027 | 10/1987 | World Int. Prop. O. . |
| 88/09961 | 12/1988 | World Int. Prop. O. . |

OTHER PUBLICATIONS tungstates" J. Am. Chem. Soc., vol. 109, No. 21, pp. 6347–6354 (1987).

Dimotikali, et al., "Photochemistry of Heteropoly Electrolytes: the 1:12 Tungstates", Inorganica Chimica Acta, vol. 87, pp. 177–180 (1984).

Ioannidis, et al., "Photocatalytic Generation of Hydrogen by 1:12 Heteropolytungstates with Concomitant Oxidation of Organic Compounds", Inorg. Chem., vol. 24, pp. 439–441 (1985).

Papaconstantinou, et al., "Photocatalytic Oxidation of Organic Compounds with Heteropoly Electrolytes. Aspects on Photochemical Utilization of Solar Energy", Homogeneous and Heterogeneous Photocatalysis, pp. 415–431 (1986).

Hill, et al. "Catalytic Photochemical Dehydrogenation of Organic Substrates by Polyoxometalates", J. Am. Chem. Soc., vol. 107, No. 18, pp. 5148–5157 (1985).

Prosser-McCartha, et al., "Photochemistry, Spectroscopy, and X-ray Structure of an Intermolecular Charge-transfer Complex between an Organic Substrate and a Polyoxometallate, $-H_3PMo_{12}O_{40}.6$ (tetramethylurea", J. Chem. Soc. Commun., pp. 1747–1748 (1986).

Renneke, et al., "Homogeneous Catalytic Photochemical Functionalization of Alkanes by Polyoxometallates", J. Am. Chem. Soc., vol. 108, pp. 3528–3529 (1986).

Akid, et al., "Heteropolytungstates as Catalysts for the Photochemical Reduction of Oxygen and Water", J. Chem. Soc. Dalton Trans., pp. 395–399 (1985).

Folcher, et al., "Reduction photochimique des polytungstates Mise en evidence d'un effet photogalvanique", Can. J. Chem., vol. 63, pp. 2703–2706 (1985).

Chem. Abstracts, 66:2442g (1967).

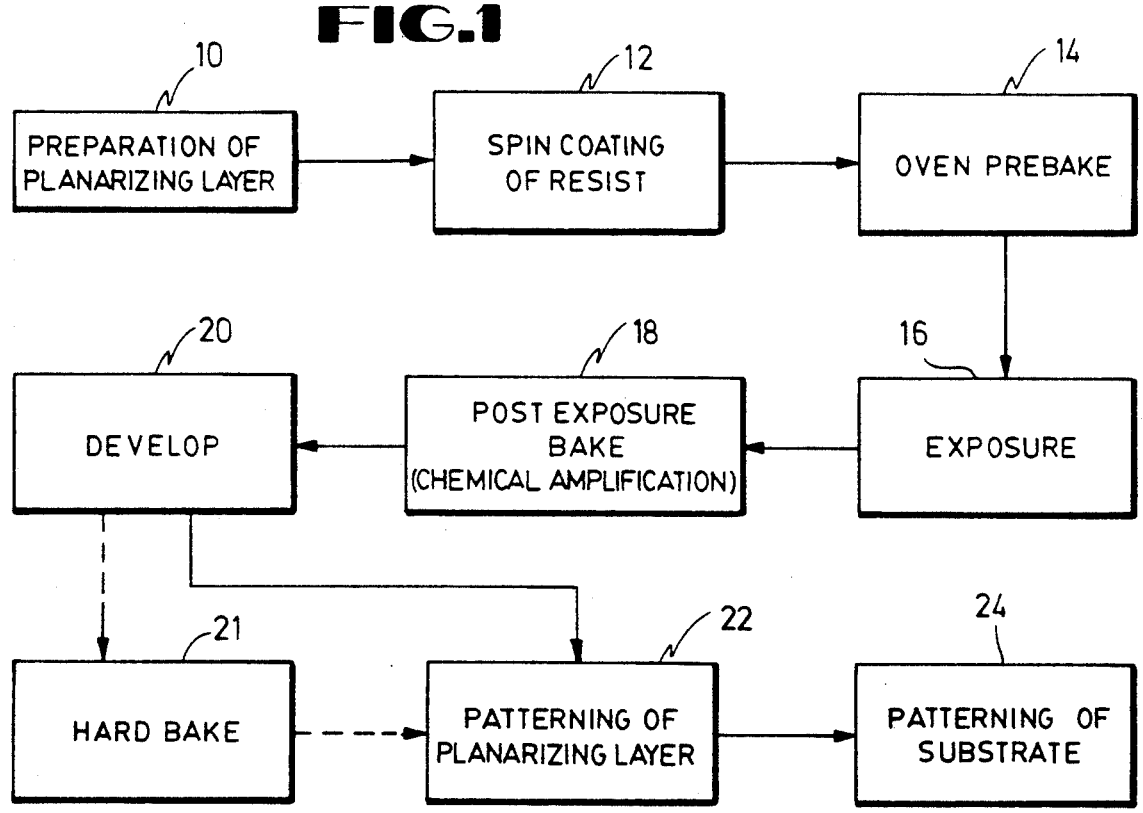
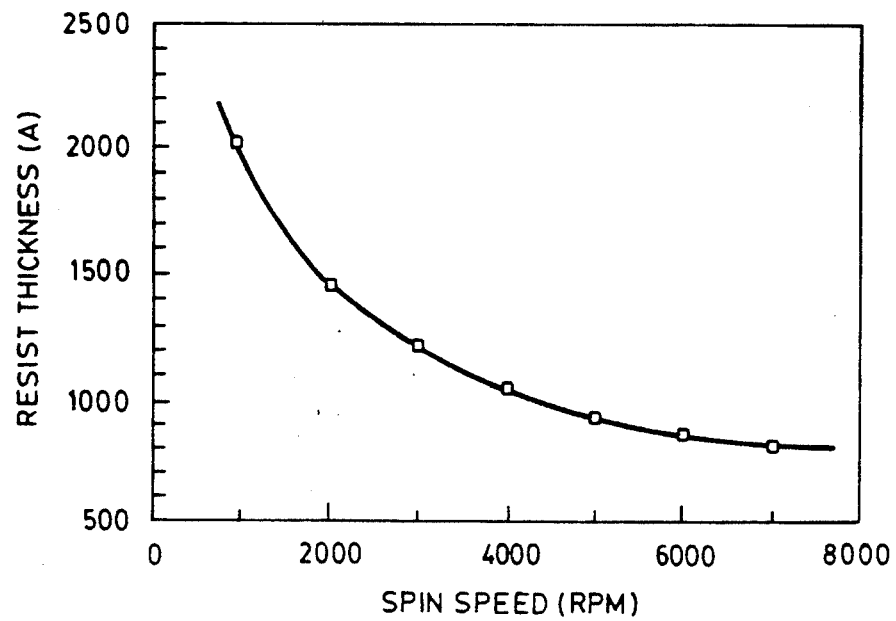

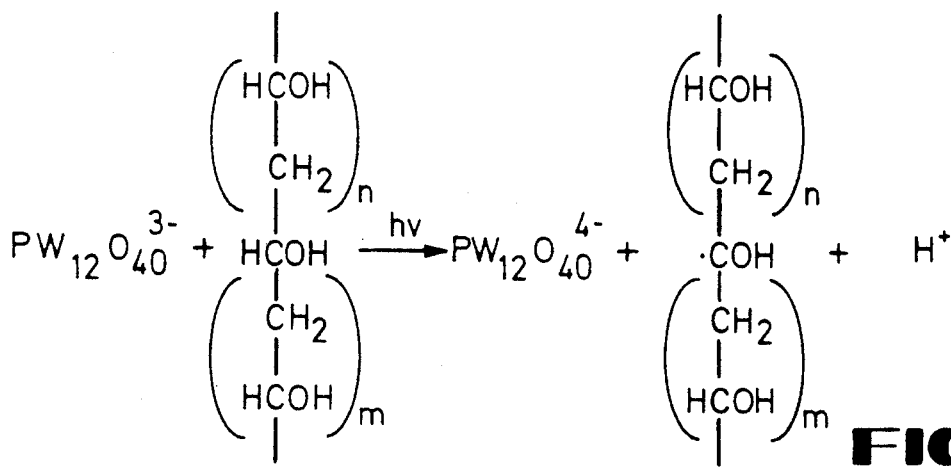
FIG.2A
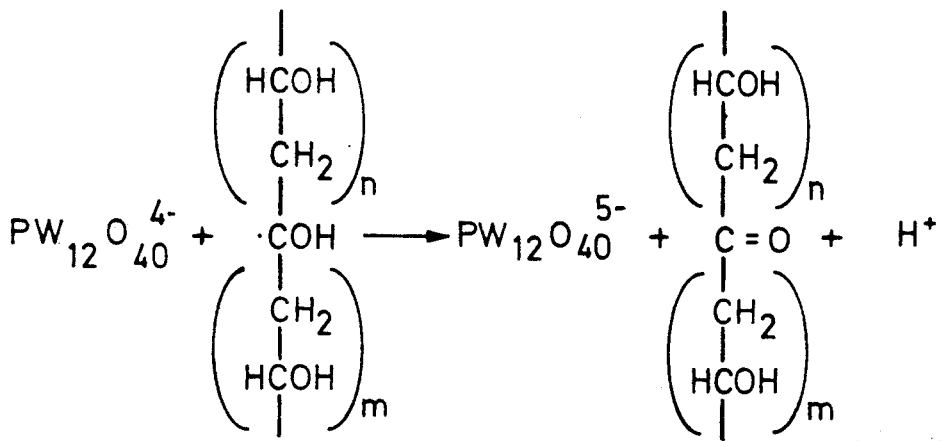
FIG.2B
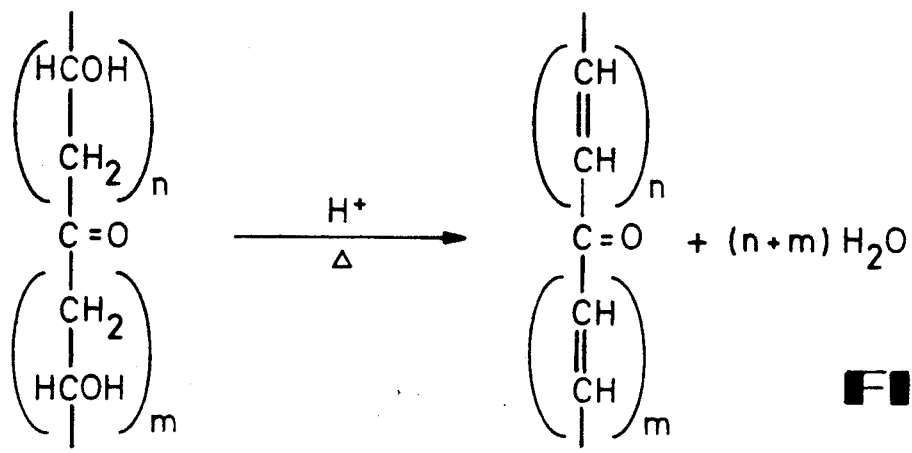
FIG.2C
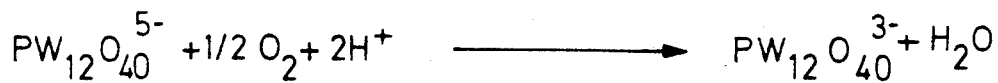

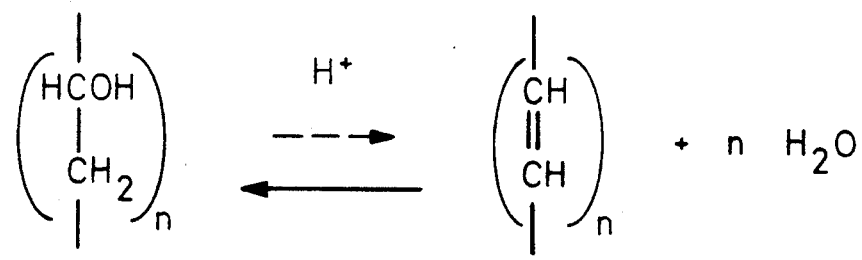
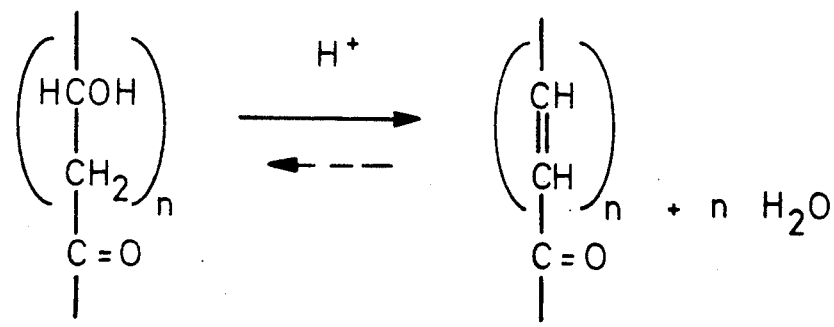
FIG.3
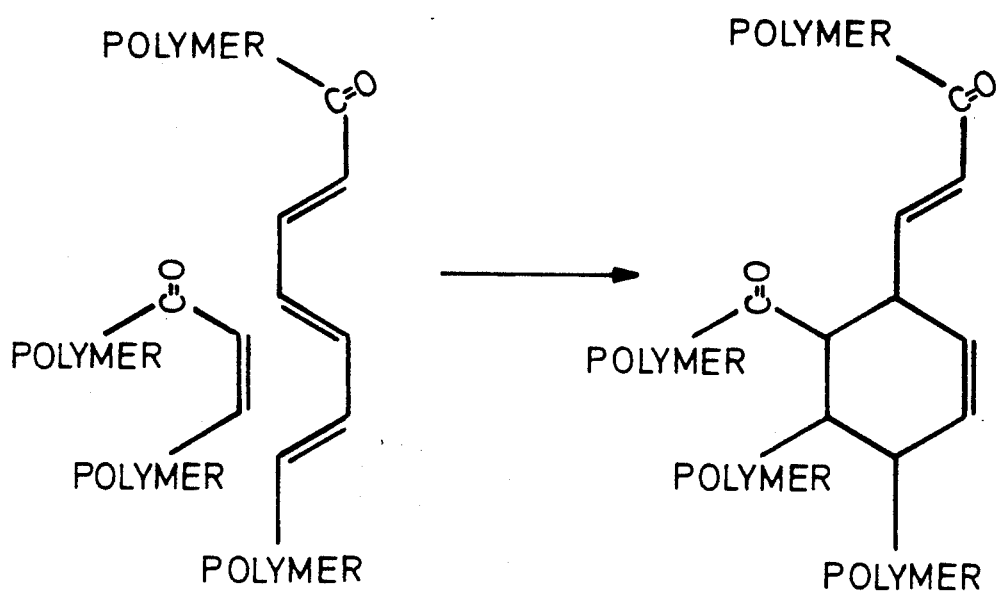
FIG.4

PATTERN FORMING AND TRANSFERRING PROCESSES

BACKGROUND OF THE INVENTION

1. Field of the Invention

This invention relates to radiation sensitive materials and their use in pattern forming and transferring processes. More particularly, it relates to use of radiation sensitive materials based upon mixtures of polyoxometalates and organic compounds.

2. Description of the Related Art

Radiation sensitive materials, i.e. materials which change properties when exposed to some form of radiation, have many industrial applications. For example, such materials are typically used to make photographic and x-ray imaging film. Such film typically consists of a layer of radiation sensitive material deposited on a transparent sheet of substrate. A pattern or image may be formed in the film by exposing regions of the radiation sensitive layer to varying doses of radiation.

Radiation sensitive materials that have certain characteristics can be used in pattern transfer processes, wherein a pattern or image is first formed in a layer of the radiation sensitive material, and then the pattern is transferred to a second material. This type of technique is used, for example, in microlithography, photoengraving, and the manufacture of masters for optical recording.

With the increasing importance of computer technology in society over recent years, microlithographic techniques for making integrated circuits on semiconductor chips have received a great deal of attention. In microlithographic processes, radiation sensitive materials are used as resists in masking patterns to be etched into an underlying layer on or in a silicon wafer. In such processes, a layer of radiation sensitive material is typically coated on the wafer. A pattern is formed in this layer by exposing selected areas of the layer to radiation, e.g. ultraviolet light. Exposure to such radiation acts to alter the radiation sensitive material in such a way that either the exposed or unexposed areas of the photoresist layer can be removed (i.e. developed), e.g. with a solvent or gas plasma with or without an electric field. Thus, windows can be opened in the radiation sensitive layer to expose selected areas of the underlying silicon substrate. Subsequently, the exposed areas of the silicon substrate can be etched, while the remaining areas of the radiation sensitive layer act to resist the etch process and thus protect the underlying areas of substrate. This effectively transfers the pattern which was formed in the radiation sensitive material to the silicon substrate.

In such a process, since the developed layer of radiation sensitive material resists the etch process during the pattern transfer step, it is commonly called a "resist". If ultraviolet (UV) or visible light is used to expose the etch resistant material, that material is typically referred to as a "photoresist".

Radiation patterns are typically projected onto an unexposed resist layer through a mask or reticle. One way is to place the mask over the layer, some areas of the mask being radiation attenuating and others being transparent. Radiation can then be directed through the mask to the resist layer, and the resist areas underlying the transparent regions of the mask will be exposed. In this technique, the pattern on the resist layer will be the same size as on the mask. The mask may be placed directly onto the resist layer, a technique called contact lithography, but the more frequently used technique is to provide a small gap between the mask and the resist layer. The latter technique, commonly referred to as proximity lithography, minimizes damage to the mask since physical contact with the resist layer is avoided.

The image formed in the resist layer can be reduced in size by using projection lithography. Problems can arise in connection with this technique if the thickness of the resist layer approaches the depth of focus of the equipment used. For example, if the resist layer required to protect existing topography on a substrate is about 1 micron, and the depth of focus is about 1 micron, the plane of focus must be precisely located in the middle of the resist layer, or the pattern projected into the upper or lower thickness of the resist layer may be out of focus, resulting in a blurred pattern.

To address this problem, bilayer resist systems are sometimes used. In this type of system, a first layer, often called a "planarizing layer" since it is used to planarize existing topography on the substrate, is coated onto the wafer. Then, a film of radiation sensitive material is coated onto the planarizing layer. The pattern is then projected onto the photosensitive layer and developed. The planarizing layer is then etched, followed by etching the wafer.

The continuing trend in the manufacture of semiconductor devices is toward smaller and smaller device sizes, allowing a higher density of devices (e.g. resistors, transistors, capacitors) on a single chip. Currently, the minimum line width used in production microlithography is around 0.8 micron. The minimum feature size that can be achieved in photolithography is often limited by exposing wavelength. Within the next decade, minimum feature sizes of less than 0.5 micron have been projected to become the norm. Existing near UV exposure systems have typically been unable to provide the resolution needed to print these size features. As a result, there is great interest in exposure sources having shorter wavelength and which can be implemented into practical exposure tools. Recognized as the most promising of these are the deep UV excimer laser (KrF operating at 248 nm), x-ray (synchrotron generated with wavelength approximately 10 angstroms), and electron beam (e-beam) sources. Ion beams may also be a viable alternative.

Because of their shorter wavelength, the x-ray and e-beam tools are in principle capable of considerably higher resolution. The resolution of excimer laser-based lithographic tools is also adequate for most applications and the capital costs associated with those systems are potentially lower. It is believed that all three technologies will play an increasing role in the manufacture of semiconductor devices.

Along with the need for higher resolution exposure tools, there is a need for photoresist materials that are suitable for the shorter wavelengths. Current resists often show poor sensitivity or unacceptably high absorbance. Thus, there is interest in devising new classes of photoresists.

Most of the microlithographic resist technology of the U.S. today is organic polymer based. A major advantage of organic over most inorganic resists is that they can be dissolved in solvents and spun on wafers to form defect-free films. This advantage in industrial applications usually outweighs the superior resolution, contrast, resistance to reactive ion etching (RIE), defocus tolerance, and over/under exposure tolerance of the sputtered, or evaporated $Ag_2Se/Ge_{0.15}Se_{0.85}$ inorganic resists.

Recently, researchers at Hitachi have developed a purely inorganic photoresist based on peroxopolyniobotungstic acid chemistry (T. Kudo, et al., *J. Electrochem. Soc.* Vol. 134, at 2607 (1987)). Using the resist in a bilayer scheme, they reported resolving 0.3 micron features reliably. The resist was reported to show deep UV, x-ray, and e-beam sensitivity. However, the peroxopolyniobotungstic acid resist has been found to be slower by about a factor of five than state-of-the art organic resists. The specific $D_{0.5}$ values are 150 mJ/cm$^2$ for deep UV light; 10 microcoulombs/cm$^2$ for 30 kV e-beam exposure; and 120 mJ/cm$^2$ for x-rays (MoL). Speed of exposure is, however, important, because of the high capital investment in exposure tools. Thus, the relatively low sensitivity is a significant disadvantage.

Several characteristics are important in relation to how well a material will perform as a photoresist in microlithography:

First, the material should be soluble in a suitable solvent, so that it can be spin-coated onto a substrate to form a film of uniform thickness. Spin-coating is the predominant industrial method for applying layers of photoresist materials on silicon and other wafers in process. Environmentally safe and economical solvents are of course preferred.

Second, the solution of the resist should be of such consistency that upon spin-coating onto a substrate, the film will be substantially defect-free, without pinholes or other irregularities, and be of substantially uniform thickness.

Third, the resist should provide sufficiently high resolution so that a well-defined pattern having small features can be formed in the film by irradiation followed by developing.

Fourth, sensitivity (i.e. the dose of radiation required for exposure) of the material to radiation is an important feature. The material should have high sensitivity so that it can be exposed quickly and economically.

Fifth, it should maintain the pattern in a well-defined manner upon developing (i.e. removal of exposed or unexposed areas) of the pattern in the photoresist layer. Preferably, the developing process used should involve only environmentally safe and economical developers.

Sixth, it should provide resistance to etching processes, particularly anisotropic etching processes, so that the pattern in the photoresist film can be precisely transferred to the underlying substrate.

Next, the photoresist material should have the ability to be easily stripped after transfer of the pattern to underlying layers.

Other characteristics which may be important involve stability and repair. The resist solution should preferably have adequate shelf life, and the image formed in the film should be stable after exposure. Also, the film should be relatively easy to remove at all processing stages in case of error in processing.

There is a continuing need to develop improved photoresist materials and systems which exhibit these and other characteristics. Improved radiation sensitive materials and processes would also be useful in other contexts which involve transferring patterns or images from one medium to another. It is accordingly an object of the present invention to provide materials and pattern transfer processes which exhibit at least some of these characteristics, and address at least some of the shortcomings experienced by prior art systems.

As indicated above, the invention disclosed herein relates to radiation sensitive materials based upon mixtures of organic compounds and polyoxometalates. The term "polyoxometalate" refers to materials containing polyoxoanions, and is used herein to include both isopolyoxoanions and heteropolyoxoanions, and derivatives of these materials. (Herein the term "isopolyoxoanion" is used synonymously with "isopolyanion" and "heteropolyoxoanion" synonymously with "heteropolyanion". Also, when the term "polyoxometalate" is used herein, it should be understood that such material may be provided in either salt or acid forms, the salt or acid providing isopolyoxoanions or heteropolyoxoanions in solution.

Isopoly and heteropolyoxoanions can be represented by the general formulas:

| | | |
|---|---|---|
| $[M_mO_n]^{p-}$ | | isopolyanion |
| $[A_aM_mO_n]^{q-}$ | $a \leq m$ | heteropolyanion |

Where M, called the addenda or peripheral atoms or simply the metal atoms, can come from one or more of the following metals: tungsten, molybdenum, vanadium, niobium, or tantalum. These atoms are generally in their higher oxidation states when they form polyoxometalates. The atoms A are called the heteroatoms and can come from almost any group of the periodic table.

By way of background, the molecular structures of polyoxometalates are generally based on distorted octahedra that combine by sharing corners, edges, or faces. The octahedra have the general formula $[MO_6]^{R-}$ and have the metal in their interior, with the oxygens in the corners of the octahedra. When they are combined, four or five of the oxygens in a single octahedron in effect act as bridges between metal atoms of different octahedra. The remaining two or one oxygens of each octahedron are not bridging oxygens. These oxygens are bonded with single metal atoms forming short M—O bonds. These are multiple bonds because of significant pi bonding between metal d orbitals and oxygen p orbitals of suitable symmetry. These are called external oxygens since they are oriented toward the exterior of the anion. In general, these oxygens are not basic and cannot form oxygen bridges. As a result of this, the polyoxoanion structures that form are closed, and so the polymerization does not extend indefinitely. This allows the formation of well characterized polyoxoanions.

Polyoxometalates with structures based not on octahedra but on other polyhedra such as square pyramids exist, but are relatively rare (e.g. $[V_{18}O_{42}]^{12-}$). But even in these cases, external oxygens must generally be present to prevent further polymerization. In addition, there must generally not be more stable alternate structures with fewer atoms, because the polyoxoanions based on other polyhedra would decompose into these.

There seem to be two basic characteristics that limit the elements that can form polyoxometalates. First the metals that form polyoxometalates should have the correct size (cationic radius) in order to be six coordinated and so to exist in an octahedral oxide environment. In addition, they should be able to form pi bonds with the external oxygens, so they should be good p-pi acceptors. These are the properties that make the metals tungsten, molybdenum, niobium, vanadium, and tantalum in their higher oxidation states capable of forming polyoxometalates. Other elements may not have these properties sufficiently to form discrete and stable polyoxometalates.

The known structures of polyoxometalates are numerous, but some of them are more common since they are more stable in aqueous solution. Generally, when a simple salt, e.g. $Na_2WO_4$ is dissolved in aqueous solution, a series of hydrolytic processes begin which lead to the formation of different isopoly- or heteropolyoxoanions, depending on the acidity of the solution, the presence of other species and their relative concentrations, the total ionic strength, and the processing conditions.

The most common isopolyoxoanions of W in aqueous solution are the following: $[W_7O_{24}]^{6-}$, $[W_{12}O_{42}H_2]^{10-}$, $[W_{12}O_{42}]^{10-}$, $[W_{10}O_{32}]^{4-}$, and $[(H_2)W_{12}O_{40}]^{6-}$, (although the last example can also be considered a heteropolyoxoanion with H as the heteroatom.) These are easily converted from one into the other by for example, changing the acidity of the solution. Other isopolyoxoanions may be more common in non-aqueous media (e.g. $[W_6O_{19}]^{2-}$).

Many elements can act as heteroatoms in the formation of heteropolyoxoanions. As a result, the number of possible heteropolyoxoanions is in general much greater than in the case of isopolyanions. Nevertheless, there are some heteropolyoxoanion structures that are more common and stable. These are usually the more symmetric structures. One example is the Keggin structure in which there is a ratio of 1:12 between the heteroatom and the metal atoms. Polyoxometalates having this structure are formed with molybdenum and tungsten. There are related structures which are also considered fairly stable, e.g. structures in which a different metal replaces some of the metal atoms, such as replacing some tungsten atoms with vanadium atoms as in $[PVW_{11}O_{40}]^{4-}$.

In the Keggin structure the heteroatom is generally located in the center of the polyanion. It is tetrahedrally coordinated. Examples of elements that are able to act as heteroatoms in Keggin structures are P, Si, B, Fe, and Co. Changing the heteroatom can cause subtle changes in the polyoxoanion. For example, exchanging P for Si changes the charge of the anion, shifts the absorption maximum in the UV, and shifts the half-wave reduction potential. However, basic chemical properties, such as the ability to photooxidize organic compounds, are similar.

Other heteroatoms may not be compatible with Keggin type structures. For example, Mo forms a Keggin structure with P as heteratom $[PMo_{12}O_{40}]^{3-}$, but forms a quite different structure with Ce as the heteroatom $[CeMo_{12}O_{42}]^{8-}$. This last structure is different even though it has the same ratio (1:12) of hetero- to metal atoms. The octahedra that combine to form the Keggin structure contain only one non-bridging (external) oxygen whereas the octahedra which combine to give $[CeMo_{12}O_{42}]^{8-}$ contain two external oxygens.

The same heteroatom can also form more than one heteropolyoxoanion with the same metal. For example, in the case of P and W, anions are known with P:W ratios of 2:5, 1:9, 1:11, 1:12, 2:17, 2:18, 2:19, and 2:21. Some of them are very closely related; for example, $[PW_{12}O_{40}]^{3-}$ and $[PW_{11}O_{39}]^{7-}$ can be converted from one to the other by changing the acidity of the solution as in the case of the isopolytungstates.

As can be seen, many structures are possible, but in almost every case there are common characteristics that make the polyoxometalates a well defined class of chemical compounds with comparable chemical properties. The same is true for their derivatives, that is, there can be partial substitution either of the bridging oxygens with for example peroxo groups, or of the metal with other metals, e.g., replacing some of the Mo with Ti. In this last example, the new metal (Ti) can be found with even an organic ligand (e.g. $n-C_5H_5$) in the place of an external oxygen. The whole polyoxometalate can also act as a ligand of another metal, for example $[Mn^{IV}(Nb_6O_{19})_2]^{12-}$. These compounds are also treated as polyoxometalates herein, since they still contain polyhedra of metals (e.g. W, Mo, Nb, Ta, and V) with oxygens as bridging or external atoms.

The present invention relates to the photochemistry of polyoxometalates with organic compounds. This photochemistry has been studied systematically for the last 10-12 years and is well known in the literature. These studies have shown that a series of polyoxometalates can be photoreduced in the presence of a variety of organic compounds. Polyoxometalates that have been studied extensively include 1:12 and 2:18 heteropolymolybdates and the corresponding heteropolytungstates, mixed heteropolyanions such as $[PMo_{10}V_2O_{40}]^{5-}$ and $[PW_{10}V_2O_{40}]^{5-}$, and isopolyoxoanions such as $[W_{10}O_{32}]^{4-}$, $[Mo_7O_{24}]^{6-}$, and $[V_{10}O_{28}]^{6-}$. These compounds have mainly been studied because of their utility in photocatalytic oxidation of organics, and photoproduction of hydrogen.

SUMMARY OF THE INVENTION

In one broad aspect, the present invention provides a process for transferring a pattern from a layer of a radiation sensitive material into an underlying second material. The process includes the following steps: A layer of radiation sensitive material comprising a mixture of an organic compound and a polyoxometalate is established on the second material. A pattern is formed in the layer of the radiation sensitive material by exposing selected areas thereof to radiation. Finally, the pattern is transferred into the underlying second material.

The term "radiation" is used broadly herein to include visible light, ultraviolet light (near UV and deep UV), x-rays, electron-beams, ion-beams, and other forms of radiation. Thus, a "radiation sensitive material" as used herein is a material which is sensitive to one or more forms of radiation such as those listed above.

One particularly important application of this process is in the area of microlithography. However, it should be understood that this process has numerous potential applications where it is desired to transfer a radiation created pattern or image to another material, as in optical recording, photoengraving, and other technologies.

In another broad aspect, the present invention provides a process for transferring a pattern from a layer of radiation sensitive material into one or more underlying layers of materials. In this process, which is particularly applicable to bilayer microlithographic systems, a layer of a first material (preferably organic) is established on a second material. A layer of radiation sensitive material as described above is then established on the first layer. A pattern is then formed in the radiation sensitive layer as described above. The pattern is transferred to the underlying first material, and then transferred again to the underlying second material.

In this process, the first material (which need not be radiation sensitive) in effect serves as an intermediate layer in the pattern transfer process from the radiation sensitive layer to the second material. The first material may be used to planarize and preserve an already existing topography on the second material (e.g. wafer) surface, as is typical in bilayer microlithography.

Within the radiation sensitive material, the preferred organic constituent used in these pattern transfer processes comprises a polymer. Polymeric organic compounds are preferred over non-polymers because they generally form uniform coatings that can be spun on wafers and provide good mechanical properties. However, it should be appreciated that various non-polymeric compounds, such as amides (e.g. n-methylpyrrolidone), alcohols (e.g. glycerol), carboxylic acids (e.g. hydroxycarboxylic acids) and esters (e.g. esters of phosphoric acid), may alternatively be used as the organic constituent.

More specifically, organic polymers containing hydroxyl groups are generally preferred, since they tend to undergo favorable photochemical reactions with polyoxometalates. Such polymers include polyalcohols, such as polyvinyl alcohol (PVA). The PVA may be hydrolized to varying extents, e.g. 75%, 88%, 100%, etc. Other polymers having hydroxyl groups suitable for use in the present invention include polysaccharides, hydroxyalkyl function-containing polymers, and polyhydroxystyrenes.

Other types of polymers may be preferable in some contexts both for sensitivity and for compatibility with underlying layers. For example, polymers having amide groups may be selected, e.g. polyacrylamide or polyvinylpyrrolidone. Yet others include polyethers (such as polyethylene oxides), polysulfones, and polycarbonates. Since polyoxometalates typically react photochemically even with alkanes, the classes of polymers which can be used is potentially limitless.

As for the inorganic constituent of the radiation sensitive material, i.e. the polyoxometalate, either hetero- or iso- polyoxometalates may be used. Heteropolyoxometalates are generally preferred, because they are usually more stable than isopolyoxometalates. However, the isopolyoxometalates may be more easily prepared and less expensive, and thus preferred in some contexts. $W_{10}O_{32}^{4-}$ is a particularly preferred isopolyoxometalate for use in the present invention.

For greatest stability, the preferred structures of the polyoxometalates are those that contain octahedra. The preferred number of metal (addenda) atoms in either the isopolyoxoanions or heteropolyoxoanions is from 4–36, more preferably between about 6 and 18. Most preferably, the number is 6, 7, 8, 10, 12, or 18.

When heteropolyoxometalates are used, the preferred ratios of heteroatoms to metal (addenda) atoms are 1:6, 1:9, 1:11, 1:12, 2:17, 2:18, 2:19, and 2:21, for stability of the molecular structure.

In one preferred embodiment, the majority of metal atoms of the polyoxometalate are tungsten. Polytungstates are generally stable compounds which readily undergo photochemical reactions with organics. They generally have a high resistivity to oxygen plasma. Tungsten, due to its high atomic number, exhibits a high absorption cross-section (coefficient) with x-rays. Finally, some polytungstates are commercially available and relatively inexpensive.

If the radiation source to be used emits in the near UV or visible, molybdenum will generally be the preferred majority metal atom over tungsten, because of its superior absorption of radiation in that wavelength range. However, for shorter wavelengths, the polytungstates will generally be preferred.

Other metals which may be used include, e.g., niobium, vanadium, and tantalum. These metals generally form polyoxometalates that have structures similar to the polytungstates and polymolybdates. The polyoxometalate may be designed to include a mix of metals, e.g. $PV_2W_{10}O_{40}^{5-}$, and thus combine various properties of each. In this way, sensitivity over a wider range of wavelengths may be provided.

When a heteropolyoxometalate is used as the inorganic constituent, the heteroatoms may be selected from numerous elements, the most common and well-studied being phosphorus, silicon, germanium, cobalt, hydrogen, iron, arsenic and boron. The UV spectrum of the heteropolyoxometalate varies with this selection, and thus the preferred choice may depend on its application. Generally, phosphorus is preferred because it forms stable heteropolyanions having high radiation sensitivity. These compounds are well studied; $[PW_{12}O_{40}]^{3-}$, the anion of phosphotungstic acid, is probably the most studied heteropolyanion and is available commercially.

The ratio of polyoxometalate to organic in the radiation sensitive material should preferably be selected such that, when exposed to a sufficient dose of radiation, the organic constituent will undergo substantial photoreaction. Care should be taken that the metal content not be so high that the material would become excessively absorbing to radiation. This might create problems in achieving uniform exposure throughout the thickness of a layer of the material.

In a preferred embodiment, the radiation sensitive material is provided in a solution, which may be spin coated onto another material to establish a layer thereon. Water is the preferred solvent for most purposes for environmental and cost reasons. However, if water is not a suitable solvent, other solvents may be used. For example, when the organic constituent is polyvinyl pyrrolidone, a mixture of water and ethylcellosolve typically provides a good solvent. Other suitable solvents depending upon selection of the organic constituents include alcohols, ethers, and other polar organic solvents.

The concentration of the radiation sensitive material in the solution can be adjusted to result in a desired film thickness. Generally, the greater the viscosity of the solution (which is largely determined by the concentration of the organic constituent), the thicker the spun film will be. The preferred film thickness depends upon the concentration and absorption characteristics of the radiation sensitive material, the desired film quality, etc.

After the layer of radiation sensitive material is established on the underlying material, a pattern is then formed by exposure to radiation. The pattern may be formed by various techniques, e.g. by contact, proximity, or projection lithography. The radiation sensitive materials used in the present invention can provide superior sensitivities to conventional photoresist materials, thereby reducing exposure time and increasing productivity.

In one preferred embodiment, the pattern is developed in the layer of radiation sensitive material prior to the transferring step. The term "develop" as used herein means removal of either the exposed or unexposed areas of the radiation sensitive layer. If the exposed regions are removed, the radiation sensitive material is functioning as a positive resist. Conversely, if unexposed regions are removed, the material is functioning as a negative resist. Whether the material acts as positive or negative resist will depend upon the material and developer used.

Removal of the exposed or unexposed areas can be achieved, for example, by dissolving such areas in a solvent. With a positive resist system, exposing the resist layer to radiation makes the resist material either more volatile or more soluble in a liquid developer, and thus the exposed areas can be vaporized or dissolved in a solvent at a greater rate than the unexposed areas. In a preferred positive resist system provided by the present invention, the developer solvent comprises sulfuric acid in water, having a pH of 1.6, for example. This developer solvent is particularly useful when the radiation sensitive material comprises a mixture of 2-hydroxyethyl methacrylate and phosphotungstic acid [$H_3PW_{12}O_{40}$].

In a negative resist system, exposing the resist layer to radiation makes the resist material either less volatile or less soluble in a developer, and thus unexposed regions can be vaporized or dissolved at a greater rate than the exposed regions. In a preferred negative resist system provided by the present invention, the developer solvent comprises an aqueous solution of phosphoric acid and a polyoxometalate (e.g. phosphotungstic acid). The concentration of phosphoric acid is preferably between about 0.5 and 2 M, most preferably about 1 M. The concentration of the polyoxometalate may be about 0.01 M, for example. Those concentrations may be varied to affect the solubility of the organic resist constituent in the developer. This developer solvent is particularly useful when the organic compound in the radiation sensitive material is polyvinyl alcohol.

The electrolyte concentration of the developer is preferably high enough to reduce swelling in the exposed regions during developing. Generally, but depending also on the chemical nature of the acids or salts used and their interactions with the resist, the higher the electrolyte concentration of the developer the less the solubility of the resist (both exposed and unexposed) in the developer. Thus, it is advantageous in the negative resist system and sometimes in the positive resist system to adjust the electrolyte concentration of the developer to the point that the exposed regions are insoluble and do not substantially swell, and the unexposed regions are still soluble.

The desired electrolyte concentration to accomplish this purpose will generally vary depending upon the electrolyte material used. For example, when phosphoric acid is used as the developer, a concentration of above about 0.2 M can be used to minimize swelling.

A potential problem which can arise during development is that of the polyoxometalate component of the resist material leaching out of the remaining resist regions (i.e. the regions that remain after developing, being the exposed regions in a negative resist system and the unexposed regions in a positive resist system) into the developer solution. This can occur because polyoxometalates are generally soluble in the developer solutions. Such a loss of the polyoxometalates is undesirable, particularly in a bilayer resist system, since the polyoxometalate constituent typically provides the etch resistance when transferring the pattern to the underlying layer.

This problem can be reduced by using developers having high electrolyte concentration, which tends to reduce swelling in the remaining resist regions (as mentioned above). This tends to isolate the polyoxometalate molecules in the remaining regions from the developer solution, thus reducing leaching.

In addition, the leaching problem can be reduced by using a developer solution having a polyoxometalate dissolved therein. By including such a polyoxometalate in the developer, the difference in chemical potential between the etch resistant material (i.e. polyoxometalate) in the resist material and that in the developer is reduced, thereby reducing leaching. For compatibility, the polyoxometalate in the developer is the same as that in the radiation sensitive material.

Leaching of the etch resistant material during developing is not ordinarily a problem with conventional organic resist systems. Usually in such systems, the resist consists of an organic polymer having a photosensitizer associated therewith. Although the photosensitizer may tend to leach into the developer solution when developing a pattern in the resist, this does not present a problem in subsequent etching steps, since the organic polymer generally serves as the etch resistant material and not the photosensitizer.

However, in a system using a resist where the photosensitizer also serves as the etch resistant substance (as is the case in certain embodiments of the present invention), then leaching of the photosensitizer into the developer solution would create a problem. Another aspect of this invention provides two general methods for minimizing this potential leaching problem.

Thus, two general methods are provided for developing a layer of radiation sensitive material containing an etch resistant substance (e.g. polyoxometalate) in such a manner so as to hinder leaching of the etch resistant substance, the layer of radiation sensitive material including areas which have been exposed to radiation. The first method comprises dissolving either the exposed or unexposed areas of radiation sensitive material in a solution of the etch resistant substance. The second method comprises dissolving either the exposed or the unexposed areas of radiation sensitive material in a solvent having a sufficiently high electrolyte concentration such that the undissolved areas of radiation sensitive material (i.e. the areas which do not dissolve in the solvent) substantially do not swell in the solvent. These methods may be combined so that the developer solution includes the etch resistant material and has a high electrolyte concentration.

The layer of radiation sensitive material may be baked (i.e. heated) following exposure and prior to development to enhance the sensitivity by propagating a photoinitiated reaction in the exposed regions. This post exposure bake step, in the negative resist system, is believed to cross-link the organic constituent in the exposed regions, thereby further decreasing its solubility in the developer solvent. In addition, a post exposure bake can also be used to cause a reaction in the unexposed regions that either increases or decreases the solubility in those regions.

It should be appreciated that the preferred developers used in the present system, being aqueous, are environmentally advantageous over the organic developers used in conventional negative resist systems.

Upon completion of developing, the system may be rinsed to stop the development process, and remove remaining developer and stray polyoxometalates. In one preferred embodiment, the rinser is HCl having a concentration exceeding about 0.5 M. This rinser is particularly useful when the patterned layer is Si or $SiO_2$ and when the polyoxometalate used is phosphotungstic acid. Other suitable rinsers may include other acids or salt solutions; the pH and ionic strength should be adjusted so that the polyoxometalate in the resist will remain stable. Preferably, the rinser has sufficiently high acidity or ionic strength to reduce dissolution or excessive swelling of the organic constituent of the resist.

The next broad step in these processes involves transferring the pattern from the layer of radiation sensitive material to the underlying layer. This may generally be accomplished by attacking the uncovered areas, i.e. those parts of the underlying layer where the radiation sensitive material has been removed. The remaining areas of radiation sensitive material serve to protect the underlying material from attack so that the pattern may be transferred.

The uncovered areas of underlying material are preferably etched by a dry process, although wet etching may be used. A dry process involves etching the underlying layer with a plasma (i.e. ionized gas). The plasma may be isotropic (non-directionally etching) or anisotropic (i.e. etching undirectionally, perpendicular to the layers). This latter process may be accomplished using an electric field, and is commonly referred to as reactive ion etching (RIE).

When a wet etch is used, the choice of etching solvent will of course depend upon the underlying layer being etched. Generally, concentrated aqueous acids are preferred. If the underlying layer is silicon, HF would be preferred, while HCl could be used to etch aluminum. phosphoric acid may also be used.

RIE is preferable when anisotropic etching is important, e.g. for deep directional etches into the underlying layer. Etching with a plasma or wet solvent may be adequate when shallow etches (i.e. on the order of thickness of the overlying resist layer) are needed.

In one preferred embodiment, the etching gas is oxygen. Oxygen is particularly useful when the material underlying the radiation sensitive layer is organic, as is typical of planarizing layers in bilayer microlithographic systems. When oxygen is used to etch, the polyoxometalate constituent in the resist layer provides the etch resistance, while the exposed organic layer is etched all the way through. It should be noted that much of the organic constituent of the resist may be stripped during the pattern transfer.

It should be understood that when it is stated herein that a material is "etch resistant" or provides "etch resistance", this does not necessarily mean that absolutely none of the material is removed by the etching process. Rather, it means that the material is more resistant to etching than the underlying layer being etched, so that a pattern can be transferred before completely removing the etch resistant material.

In another preferred embodiment (particularly useful in single layer microlithography), the etching gas contains one or more halogens, such as chlorine, bromine, or fluorine. Fluorine containing gases are particularly useful when the underlying layer contains silicon or germanium. When a fluorine containing gas is used to etch, the organic compound in the resist layer provides the etch resistance, while much of the polyoxometalate may be stripped during the pattern transfer. This occurs because the halides and the oxyhalides of the tungsten, etc. are volatile. Chlorine containing gases are preferred when patterning aluminum and semiconductors composed of group III and group V elements of the periodic table, e.g. GaAs.

The term "halogen containing gas" is used herein to mean a gas containing one or more halogens or halogen compounds. The term "fluorine containing gas" is used to mean a gas containing one or more fluorine compounds, e.g. $NF_3$, $CF_4$, $SF_6$.

In bilayer processes provided by this invention where the pattern is transferred to an intermediate layer and then to a second material (substrate), the intermediate layer will typically be organic while the substrate will be inorganic, e.g. silicon, aluminum, or silicon dioxide, as in bilayer microlithography. In this type of process, an oxygen RIE is preferably used to etch the organic intermediate layer. The polyoxometalate in the top resist layer serves to resist the oxygen etch. In the second pattern transfer step into the substrate, a halogen RIE is preferably used, the intermediate organic layer providing etch resistance. During this second etch, oxygen is preferably added to the halogen RIE to minimize undesired polymer formation. The oxygen supply should be controlled so that the intermediate organic layer will not be etched away before pattern transfer is complete.

It should be noted that the preferred etching steps (i.e. oxygen RIE to etch intermediate layer, halogen-/oxygen mix RIE to etch substrate) may also serve to strip the top resist layer, thus eliminating the requirement of a separate stripping step for that layer. The first etch (oxygen) will typically strip much of the organic constituent in the radiation sensitive layer, but some of the organic constituent may be shielded by the polyoxometalate and thus survive the etch. During the second etch, the halogen will typically strip the polyoxometalate, and the oxygen mix can strip the remaining organic constituent.

In a single layer system, after pattern transfer to the underlying layer, the radiation sensitive layer may be stripped, e.g. with a concentrated base solution such as tetramethyl ammonium hydroxide. Alternatively, the polyoxometalate constituent could be washed away using water or ethanol, while the organic constituent could be stripped using an oxygen plasma.

The resists provided by this invention can also serve as implantation masks for use in conventional ion implantation techniques. Thus, the patterned layer of radiation sensitive material can be used to shield the covered areas of the underlying layer, while the uncovered areas are implanted with dopant ions (e.g. As, Ga, etc.).

Another broad aspect of the present invention relates to a process for transferring a pattern from a layer of a first radiation sensitive material into a second radiation sensitive material, including the following steps: A layer of a first radiation sensitive material comprising a mixture of an organic compound and a polyoxometalate is established on a radiation transparent material. A pattern is photolithographically formed in the layer of first radiation sensitive material, consistent with the techniques described above (i.e. the pattern is formed by exposing selected areas to radiation and then developed). The polyoxometalate in the first radiation sensitive material is reduced such that the patterned first radiation sensitive material becomes opaque to radiation. Finally, the pattern is transferred into a second radiation sensitive material by irradiating that material through the opaque pattern. Preferably, the organic compound is removed by oxidation prior to the pattern transferring step. This process is particularly applicable in the area of mask making.

Another aspect of the present invention provides a method for making a mask for use in transferring a pattern by radiation, including the following steps: A layer of radiation sensitive material comprising a mixture of an organic compound and a polyoxometalate is established on a radiation transparent material. A pattern is formed in the layer of radiation sensitive material by exposing selected areas of the layer of radiation sensitive material to radiation. The pattern is then developed by removing either the exposed or unexposed areas of the layer of radiation sensitive material. The remaining organic compound may then be removed, e.g. by oxidation. Finally, the polyoxometalate in the remaining areas of the layer is reduced (e.g. by a hydrogen containing gas) such that the polyoxometalate becomes opaque to radiation.

The reduced polyoxometalates usually absorb light at longer wavelengths. Reduction can also produce thin, electrically conducting metallic patterns. One potential use of such patterns is as a diffusion barrier to an overlying metal. Diffusion barriers are typically used in integrated circuit devices to reduce migration of patterned metal into an underlying gate polycrystalline silicon component. Such diffusion of metal through the crystalline structure, if allowed to occur, can create metal spikes and short circuit the device. Since the metals contained in the polyoxometalates typically have relatively high melting points, the reduced polyoxometalate patterns can form effective diffusion barriers.

Therefore, another aspect of this invention provides a process for forming an electrically conducting pattern on a surface, such as polycrystalline silicon. In this process, a layer of radiation sensitive material (mixture of polyoxometalate/organic compound) is established on the surface and photolithographically patterned consistent with the techniques described above. The organic compound is oxidized and the polyoxometalate is reduced such that the patterned layer becomes electrically conducting. This layer may serve as a diffusion barrier to a layer of metal (e.g. aluminum) deposited thereover.

Another broad aspect of the present invention provides a process for forming an image in a layer of radiation sensitive material, including the following steps: A layer of radiation sensitive material comprising a mixture of an organic compound and a polyoxometalate is established on a substrate, e.g. a sheet of film. An image is then formed in the layer of radiation sensitive material by exposing the layer to radiation which is passed through an object including regions that absorb the radiation to differing extents (e.g. a mask, a body part to be imaged, etc.). The radiation preferably comprises x-rays, as is typically used in medical applications.

Alternatively, images can be written in the radiation sensitive material by selectively exposing regions to electron or ion beams, as in lithography. This can be done, e.g., by moving either the beam or the platform on which the film is mounted.

BRIEF DESCRIPTION OF THE DRAWINGS

FIG. 1 is a flow diagram of a preferred microlithographic process as provided by the present invention.

FIGS. 2a, 2b, and 2c show a proposed mechanism photoreaction of polyvinyl alcohol, in the presence of phosphotungstic acid, to a corresponding ketone having conjugated double bonds along the polymer chain.

FIG. 3 compares the equilibrium of polyvinyl alcohol in the presence of an acid with the equilibrium of the corresponding ketone in the presence of an acid. This illustrates that when the polymer includes a carbonyl function (ketone), the polymer tends to lose water and become conjugated.

FIG. 4 shows a proposed mechanism for crosslinking the conjugated polymer of FIGS. 2a, 2b, and 2c.

FIG. 9 is a plot showing film thickness of a spun phosphotungstic acid/PVA resist as a function of spin speed.

DETAILED DESCRIPTION OF THE PREFERRED EMBODIMENTS

Figure 5:
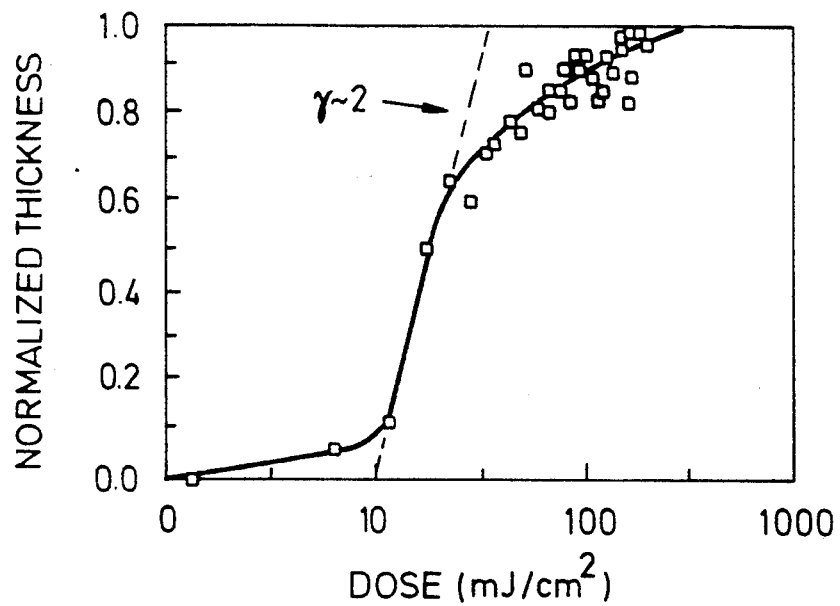
FIG. 5 is a plot showing the lithographic response of the resist used in Example 5 below.

The processes provided by the present invention, using radiation sensitive materials based upon mixtures of polyoxometalates and organic compounds, have a particularly important application in microlithography in the manufacture of integrated circuits.

There are several advantages of a system based on the photochemistry of polyoxometalates with organic compounds, making such systems particularly well suited for microlithography. First, the absorption spectra of some polyoxometalates are quite well suited for the various UV regions, some having relatively strong deep UV absorption, and transparency in the near UV and in the visible. Others absorb in the deep and the near UV regions, but are transparent in the visible. Second, because of the high atomic number of the metal in the polyoxometalate, the absorption cross section for x-ray and energetic e-beam radiation is typically much greater than for organic materials. Third, the organic component of the material can be chosen to have excellent film forming and surface-wetting qualities, providing excellent spin coatable inorganic./organic materials. Finally, the oxides typically exhibit excellent resistance to removal by oxygen plasmas, making them useful in bilayer schemes. In addition, when no longer needed, they can be rapidly removed in halogen (e.g. fluorine) containing plasmas.

The preferred photoresist for use in microlithography processes provided by the present invention comprises an aqueous solution of polyvinyl alcohol (PVA) and phosphotungstic acid. Neither compound is toxic. Advantageous features of this resist material include the following: (1) it can function as a negative tone resist that can be exposed by deep UV and x-ray radiation; (2) it has high sensitivity and high resolution; (3) its processing can be completely aqueous, being spun from aqueous solution and developed in an aqueous solution; and (4) no extreme processing conditions or requirements need be employed.

In one preferred embodiment, this material is used as a negative photoresist in a bilayer microlithographic process to take advantage of the excellent resistance of the tungsten oxide to etching in oxygen plasma. FIG. 1 depicts the process flow diagram of this preferred microlithographic process.

As shown in FIG. 1, the first step 10 of the preferred process concerns preparation of a planarizing layer on a substrate. In this step, the planarizing layer is first spun onto the substrate (e.g. wafer) and baked. This layer is preferably a commercially available organic photoresist such as novolac. It should be noted that this layer need not be radiation sensitive, since this layer is used as an intermediate layer in the bilayer process and thus is not photoimaged. Novolac is preferred for its superior etch resistance in fluorine or chlorine-containing plasmas, and because it is well characterized and accepted by the industry. The novolac is preferably applied after cleaning and priming the substrate, e.g. by spinning at 4000 RPM for thirty seconds, giving a coating of about 1.5 microns.

After spinning, the coated substrate is preferably hard baked, e.g. at 185° C. for one hour. This serves to crosslink the novolac and destroy any photosensitizer which may be present. Following the hard bake, the novolac typically exhibits excellent thermal stability. Also, being quite insoluble in water, the novolac layer will typically form a sharp boundary with the resist layer when the resist layer is spun, since substantially no intermixing of the two layers will occur. This embodiment can thereby reduce a common problem in conventional two level schemes.

A twofold advantage of using this bilayer approach is that existing topology in the underlying substrate can be planarized by the bottom layer, while keeping the imaging (top) layer thin. The planarizing ability of the novolac resins is well known and well characterized.

The next step 12 involved in the preferred embodiment is spinning of the polyoxometalate/organic (preferably phosphotungstic acid/PVA) resist material (hereafter referred to as "the resist"). For example, the resist may be spun onto the novolac at around 4000 RPM for about thirty seconds, resulting in substantially uniform coatings of around 1000 angstroms thickness. The layer thickness may be varied as desired, e.g. from about 500 to about 3200 angstroms, depending on composition and angular spin velocity. No surface preparation is generally required to spin the resist onto the novolac layer. The resist generally wets and adheres to the novolac well. The polyvinyl alcohol acts as a coating material, and can provide defect and striation free films.

The boundary between the novolac and resist layers is typically very sharp. This provides an advantage in that if a problem develops in the coating process, the wafers can simply be flushed with water, dried, and respun. This can be done at any time in the process before the post exposure bake.

The resist viscosity generally required to give 1000 angstrom films is around 3 cp. At such film thickness, edge bead problems are minimized. The resist quantity required for a six inch wafer is around 1-10 ml.

The next step 14 of the preferred embodiment is prebaking. A prebake step may be desirable after spinning to further remove moisture from the film. Because the spinning solvent is water, the prebake temperature typically need not be very high. For example, the coated wafers may be placed in an oven and baked at about 75° C. for around 8 minutes. Alternatively, a much shorter hot plate prebake could be used.

After the prebake, the next steps are exposure 16 followed by a post exposure bake 18. These two steps taken together serve to insolubilize the exposed regions of the resist layer by crosslinking the organic polymer.

The resist is preferably exposed using deep UV projection lithography. X-ray, e-beam, or other forms of radiation could also be used. Deep UV sensitivity of <50 mJ/cm$^2$ can be achieved with some of these materials. Since the resist is fairly stable, exposure can be performed immediately following the prebake, or may be delayed for up to at least 5 days.

The polyoxometalates absorb deep UV wavelengths quite effectively, and the resist does not typically bleach upon exposure.

The preferred embodiment of the resist film contains about 60% tungsten (by weight), and has a density of about 3.7 g/cm$^3$ Absorption at 248 nm may be controlled through controlling the ratio of the phosphotungstic acid (that absorbs at 248 nm) to the PVA (that is transparent at 248 nm). Such a film is substantially transparent throughout the near UV and through the visible.

The resist may be post baked for about 14 minutes on a hot plate at about 75° C. The post exposure bake is believed to provide the chemical amplification and also to crosslink the resist.

The resist does not generally become insoluble until after the post bake. As a result, the resist can be stripped with pure water even after the exposure. This can be important, because in case of process error it can allow the lithographic process to be restarted without the need for organic solvents or harsh aqueous materials. Also, if a problem is discovered with the exposure after post baking and developing of a test wafer, an entire lot of exposed wafers can be stripped simply and easily, and returned immediately to the process.

A proposed mechanism for insolubilizing the resist by exposure and post bake is shown in FIGS. 2-4. It should be noted that the discussion relating to FIGS. 2-4 is offered for illustrative purposes only, and the invention and claims of this application should not be construed as being bound by theory. Other crosslinking mechanisms can certainly be considered. Also, the proposed mechanism is shown with the particular example of a phosphotungstic acid/PVA resist, but the mechanism could be applied more generally to other polyoxometalate/organic resists.

Referring particularly to FIGS. 2a, 2b, and 2c, it is postulated that the sensitivity of the film to deep UV derives from the transfer of an electron, upon excitation, from an oxygen atom of the phosphotungstic acid to a tungsten atom. Such transfer makes the oxygen strongly oxidizing, such that it abstracts hydrogen from neighboring (complexed) PVA, oxidizing one of the polymer's alcohol groups (Step 1 in FIG. 2a). The radical promptly loses a second hydrogen and is converted to a ketone (Step 2 in FIG. 2b). In the presence of an acid (i.e. the phosphotungstic acid) and at elevated temperatures, the reacted PVA is partially dehydrated to polyolefin, conjugated to the ketone (Step 3 in FIG. 2c). Finally, as shown in FIG. 4, the polyolefin regions of neighboring polymers can undergo Diels-Alder type condensation, thereby crosslinking the system.

Both the dehydration and the crosslinking may take place in the postbaking step. The multiple dehydration reaction, representing a chemical amplification, takes place in those chains that were attacked by the excited phosphotungstate, because it is the conjugation to the photochemically formed ketone (i.e. double bond) that moves the equilibrium depicted in FIG. 3 to the right. Thus, the chemical amplification and subsequent crosslinking steps are confined to the photoreacted chains and cannot spread to unexposed regions.

The latent images in the preferred resists provided by this invention are generally very stable, so that the post bake may be delayed for as long as one week, if desired. This advantage is believed to be related to the conversion of a hydroxyl group on a polymer to a ketone upon exposure. It is theorized that the ketone is part of a defined polymer chain and cannot migrate. Thus, exposure of the polyoxometalate resist forms active centers which remain part of the polymer. These centers are substantially immobile and therefore do not tend to diffuse to other locations and degrade the image quality.

The post bake causes dehydration of PVA chains that contain the photochemically formed ketone. The result of the dehydration is the formation of long chains of conjugated double bonds, starting at and conjugated to the ketone. The long conjugated chains contain electron rich diene regions while shorter conjugated chains are more dienophilic in character because of closer proximity to the carbonyl. This gives the potential for crosslinking through reactions such as a Diels-Alder. Deep UV flood exposure can be employed at this stage to increase the degree of crosslinking, if desired. By use of the post exposure bake step, the sensitivity of the material may be substantially improved.

A thermal reaction is believed to also occur during post baking resulting in the crosslinking of the material. During this reaction, it is believed that the polyoxometalate thermally oxidizes the PVA in much the same way as occurs photochemically. The thermal reaction also results in crosslinking, because once the ketone linkage is formed, dehydration and crosslinking result from the post bake. The crosslinking induced by the thermal reaction can occur uniformly over the wafer, with no regard to the image. Upon excessive thermal crosslinking, the resist layer can become completely insoluble, with no image formation observed upon developing.

The rate of thermal oxidation is generally very low at room temperature, but rises at elevated temperatures, most likely with Arrhenius dependence. As a practical matter, the thermal reaction typically sets limits on the length and temperature of the post bake, and to a lesser extent, the prebake. Post bake conditions should thus preferably be optimized to maximize both the sensitivity of the resist and the difference between photo induced and thermally induced crosslinking.

It should be noted that although resist materials containing phosphotungstic acid may be preferred in many contexts due to its wide commercial availability, other polyoxometalates may exhibit superior spectral linearity. For phosphotungstic acid, the average value for spectral linearity is about 0.0083 absorbance units/nm. For excimer laser sources, which have a very narrow band of operating wavelengths, this material works well. However, for broad band sources, a large change in absorbance versus wavelength can cause nonuniform exposure of the resist layer. In addition, fluctuations in the spectral output of the radiation source, coupled with the variation in resist absorbance with wavelength, may cause reproducibility problems. Thus, other polyoxometalates may be superior in performance to phosphotungstic acid resist systems when exposed with broad band radiation sources.

Preferably, when using broad band sources, a resist having essentially flat absorbance over the entire exposure spectrum should be selected. This can be done with a resist containing a mixture of the anions diphosphotungstate $[P_2W_{18}O_{62}]^{6-}$ and phosphotungstate $[PW_{12}O_{40}]^{3-}$ provided in acid or salt form so as to be compatible in this application. The mechanism by which the PVA becomes insoluble is similar in each case, so changing polyoxometalates will generally cause little change in the properties of the resist.

The useful exposure region can be extended to longer wavelengths, including those in the near UV, by using suitable polyoxometalates (e.g. $W_{10}O_{32}^{4-}$ or polymolybdates) as photosensitizers. It is also possible to use mixed polyoxometalates where, for example, tungsten atoms have been substituted by molybdenum or vanadium. It is thus possible to engineer materials that can be exposed by both deep UV and near UV light.

The next step 20 following exposure 16 and post bake 18 is developing the resist layer. The developing and rinsing of the resist is preferably carried out in a nontoxic, aqueous, acidic solution. The preferred developer formulation for the negative resist system is a mixture of water, phosphoric acid (1 M), and phosphotungstic acid. The preferred rinser consists of an aqueous 1 to 3 M solution of HCl, unless the ultimately processed layer is aluminum, in which case the rinser could be another acid or salt, e.g. ammonium salt.

The developer is preferably optimized to be a minimal developer for the resist. The rinser is preferably formulated to be a nonsolvent for the resist, but to be miscible with the developer, and be capable of removing residual polyoxometalate.

In the preferred embodiment of the developer, the phosphotungstic acid therein can serve two roles in developing. First, it can interact strongly with the PVA, thereby enhancing the dissolution of the unexposed material. Second, it can serve to minimize leaching of polyoxometalate from the exposed regions. Since there is no covalent bond between the polyoxometalate and the PVA in the resist material, it is possible for the polyoxometalate to be leached from the exposed regions during developing. In fact, if the developed wafer is rinsed with ethanol, the phosphotungstic acid can be completely stripped from the exposed regions. Adding polyoxometalate (e.g. phosphotungstic acid) to the developer can equalize the chemical potential of the polyoxometalate in the developer, and thereby reduce the tendency for leaching.

As in most negative resists, there is the possibility of swelling during developing. The primary role of the phosphoric acid is to make the resist only moderately soluble in the developer, reducing the possibility of swelling.

When aluminum is not exposed, HCl is the preferred rinser because it precipitates the PVA, reducing the swelling caused by the developer. In addition, it still dissolves the phosphotungstic acid, removing any developer residue. There may be very little leaching of the polyoxometalate by the HCl rinser because the precipitation of the PVA by the rinser causes the PVA to tightly bind the polyoxometalate.

When the use of HCl is not desired, other acids or salt solutions such as solutions of ammonium salts may be used, since they also provide high electrolyte concentrations. Relatively concentrated salt solutions can perform the same function as the acid, i.e. make the resist sparingly soluble or insoluble in developer and rinser respectively. In addition, the phosphotungstic acid might be eliminated from the developer if desired, even at the expense of some leaching, if the remaining polyoxometalate provides sufficient etch resistance.

After developing and rinsing, the pattern formation in the resist layer by photolithography is complete. The next step 22 is transferring the pattern to the underlying planarizing layer (novolac, polyimide, or other polymer) by oxygen RIE. If desired, step 22 may be preceded by a post develop hard bake step 21 to harden the patterned resist layer. During that optional hard bake 21, the resist should be heated under such conditions to remove residual developer solvent, but care should be taken so as not to cause the organic polymer constituent of the resist to flow.

With novolac, the following RIE operating conditions may be used: 100 sccm $O_2$ flow; power of approximately 80 W and 0.1 $W/cm^2$; pressure of 10 mTorr; 300 V D.C. bias; and etch time of 19 minutes. The inorganic tungsten oxides in the resist layer provide an essentially impervious layer to the oxygen plasma. With the high degree of anisotropy that can be achieved in the RIE, the pattern can be transferred with high fidelity.

Under these RIE conditions, the pattern can be transferred completely through the novolac layer to the silicon wafer surface. The relatively high D.C. bias voltage can give good anisotropy while minimizing sputtering of the polyoxometalate. Since the novolac in the preferred embodiment has previously been baked and crosslinked, it generally shows no tendency towards thermal flow during RIE or during any required post develop hard bake of the resist.

It should be noted that a significant amount of the organic PVA constituent in the top resist layer is typically stripped during the oxygen RIE.

After pattern transfer to the novolac layer, the pattern is next transferred to the substrate in step 24. When novolac is used as the intermediate etch resist, conventional processing, e.g. fluorine RIE, can be used to carry out the etch.

A significant advantage of the polyoxometalate based resist materials provided by the present invention is that the top layer can be stripped in halogen (e.g. fluorine) containing plasmas used to pattern the substrate. The polyoxometalates form volatile fluorides and oxyfluorides in a fluorine/oxygen plasma, and also volatile oxychlorides in chlorine and oxygen containing plasmas, and can thus be removed in this stage without an extra stripping step.

Preferably, the fluorine/oxygen ratio in the plasma during this step is initially adjusted so that the organics (novalac and PVA) are etched at the same rate as the inorganics (substrate and polyoxometalate). This can serve to strip the polyoxometalate, minimize polymer formation on the etched substrate surfaces, and completely strip any residual PVA in the top resist layer. After this is accomplished, the oxygen flow should be controlled to avoid rapid etching of the novolac layer.

After substrate etching and removal of the top layer, the novolac bottom layer can be stripped in an oxygen plasma. In the event of residual material, an aqueous liquid stripper suitable for novolac can also be used to remove any residual inorganic material.

EXAMPLES

The following examples are designed to illustrate certain aspects of the present invention. The examples are not intended to be comprehensive of all features and all embodiments of the present invention, and should not be construed as limiting the claims presented herein.

EXAMPLE 1

4.4 g of 100% hydrolyzed polyvinyl alcohol (PVA), nominal molecular weight 14,000, was added to a 250 ml Erlenmeyer flask containing 100 ml of deionized water (resistivity=17.8 megaohm-cm). The solution was stirred constantly and heated slowly, reaching a temperature of 80°–85° C. after about 30 minutes. The solution was maintained at this temperature for an additional 15 minutes to cause complete dissolution of the PVA, then removed from heat and allowed to cool to room temperature. The final solution volume was approximately 102 ml. All subsequent steps were conducted under filtered light such that wavelengths shorter than about 500 nm were eliminated.

50 ml of the PVA/water solution was then placed in a beaker and 7.2 g of phosphotungstic acid ($H_3PW_{12}O_{40}$·$xH_2O$, FW 2880.17) added. This mixture was stirred for 15 minutes until the phosphotungstic acid completely dissolved. The resulting mixture is hereinafter referred to as "the resist".

A developer solution was made by making a 0.01 M aqueous solution of phosphotungstic acid. A 0.2 M aqueous solution of HCl was used as the rinser.

It should be noted that the resist, developer, and rinser materials as described in this and other examples may be filtered, if desired. The filtering may be done by using, e.g., nylon membrane filters with pore size of 0.2 microns, and may be repeated if desired.

A layer of American Hoechst AZ 1350J SF novolac photoresist (novolac) was deposited onto a bare silicon wafer by spin coating. The spinning was conducted at 4000 RPM for 30 seconds. The final coating thickness was 1.5 microns. The novolac layer was crosslinked by hard-baking at 185° C. for 1 hour.

A layer of the resist was then spin coated onto the novolac layer. The spinning was conducted at 4000 RPM for 30 seconds. The resulting thickness of the resist layer was 1000 angstroms. The wafer was then placed on top of an insulator in a 77° C. oven and baked for 8 minutes (the "prebake").

Wafers prepared in this manner were then exposed through a patterned mask to radiation by vacuum contact lithography using a broad band DUV light from a high pressure mercury arc lamp with maximum light intensity at about 254 nm.

After exposure, the wafer was baked on a metal surface in an oven. The oven temperature was 77° C and the duration of the post exposure bake was 16 minutes (the "postbake").

The wafer was then developed and rinsed as follows: The wafer was immersed and constantly agitated in a flat dish containing approximately 150 ml of the developer for 75 seconds, then transferred to a second dish containing an equal amount of developer and agitated for 15 seconds. The wafer was then transferred to a flat dish containing approximately 150 ml of rinser, agitated for 10 seconds, transferred to a second dish containing rinser and agitated for 5 seconds. The wafer was then removed and blown dry with a jet of filtered air.

After developing, rinsing, and drying, the exposed image became visible on the surface of the novolac layer. The resist acted as a negative photoresist, meaning that the exposed regions became insoluble in the developer, while the unexposed regions were washed away by the developer. Neither exposure nor developing had any effect on the novolac layer. The lithographically useful dose in this instance was found to be about 60 mJ/cm². The smallest resolved features were 1 micron.

After pattern formation by photolithography, the pattern was transferred to the underlying novolac layer by oxygen RIE. The RIE operating conditions were as follows:

O₂ flow: 5 sccm
Power: approx. 60 W, approx. 0.1 W/cm²
Pressure 10 mTorr
D.C. Bias: 540 V
Etch Time: 25 minutes These RIE conditions caused the pattern to be transferred completely through the novolac layer to the silicon wafer surface.

EXAMPLE 2

A resist was made as in Example 1 except that 8.8 g of the PVA was dissolved in 100 ml of water. The resist was spun onto a bare silicon substrate at 5000 RPM for 30 seconds. This gave a film thickness of about 3200 angstroms. The wafer was prebaked as in Example 1.

The wafer was exposed through projection lithography using narrow band deep UV light from an excimer laser projection printer operating at 248 nm. There was 5x image reduction and the projection lens had a numerical aperture of 0.35.

After exposure, the wafer was post baked for 2 minutes at about 79° C. The wafer was developed in an aqueous perchloric acid solution having pH of 1.6. The lithographic results were similar to those in Example 1 except that features as small as 0.4 micron were resolved. The lithographically useful dose was approximately 80 mJ/cm². Though resolved, features smaller than 1 micron were swollen after developing.

EXAMPLE 3

The procedure of Example 1 was repeated, but using projection lithography as in Example 2. A new developer solution was made by dissolving 28.8 g of phosphotungstic acid in a 1 M aqueous solution of phosphoric acid. A 3 M aqueous solution of HCl was used as the rinser. Developing with this developer/rinser system was done as follows: The wafer was placed in a flat dish containing about 150 ml of the developer and constantly agitated for 1.5 minutes. The wafer was removed and sprayed with about 20 ml of fresh developer solution from a wash bottle. Then the wafer was placed in a flat dish containing about 150 ml of the rinser and agitated for 30 seconds. It was then removed and sprayed with about 20 ml of fresh rinser from a wash bottle. The wafer was then blown dry with filtered, compressed air.

In this case, features as small as 0.3 microns were resolved and there was no indication of swelling down to the smallest feature size. The lithographically useful dose was 30 mJ/cm².

Pattern transfer to the underlying novolac layer in this and subsequent examples was accomplished under the following conditions, using a different reactive ion etcher which required different operating conditions than that used in previous examples:

O₂ flow: 100 sccm
Power: approx. 80 W, approx. 0.1 W/cm²
Pressure: 10 mTorr
D.C. Bias: 300 V
Etch Time: 19 minutes

EXAMPLE 4

The procedure of Example 3 was repeated, except that approximately 10 angstrom x-rays produced by a synchrotron accelerator were used for the exposure by proximity lithography. In this instance the mask was placed with a very small space between it and the resist coating, and the exposure was done as in contact lithography. The results in this case were essentially identical except that features as small as 0.3 microns were resolved. The lithographically useful dose was about 80 mJ/cm².

EXAMPLE 5

The procedure of Example 3 was repeated, except that the wafers were "spray developed". The wafer was placed on the spinner and a puddle of developer was deposited on the wafer surface, covering the resist. The puddle was allowed to remain for 2 minutes, then the wafer was spun at 500 RPM while a stream of fresh developer was sprayed on the surface. The spray develop lasted for 30 seconds, then the develop stream was replaced by a stream of rinser. After spray rinsing for 30 seconds the spinning wafer was dried with a stream of filtered air. This procedure resulted in much more effective removal of the resist, higher effective resist contrast, and a large reduction in the "scum" left after developing.

FIG. 5 shows the lithographic response of the material obtained using this procedure. This graph shows the remaining thickness of the resist layer following exposure at various doses and developing. Thicknesses were normalized, and thus the values on the graph represent a ratio of layer thickness after exposure/developing to thickness before exposure/developing. As can be seen, the lithographically useful dose was approximately 45 mJ/cm².

EXAMPLE 6

The resist was prepared as in Example 1, except that 8.8 g of polyvinyl alcohol was dissolved in 100 ml of water. The resist was spun onto a bare silicon wafer, and then prebaked, exposed and postbaked as in Example 1. The developer was an aqueous solution of perchloric acid having a pH of 1.6. The developed wafers were rinsed in ethanol.

The wafers were then etched in an isotropic, plasma barrel etcher, using pure $CF_4$ as the etchant. The wafers were etched for approximately 7.5 minutes at a pressure of 400 mTorr. The reactor power is estimated to have been approximately 100 W. After etching, approximately 2600 angstroms of the silicon substrate and approximately 850 angstroms of the resist had been removed, giving an etch selectivity of about 3:1.

EXAMPLE 7

8.8 g of 100% hydrolyzed PVA was dissolved in 100 ml of water as in Example 1. Into 10 ml of this solution was dissolved 0.913g of phosphomolybdic acid ($H_3PMo_{12}O_{40} \cdot H_2O$, FW 1825.24). The resulting mixture served as the photoresist.

A coating of the photoresist was spun onto a bare silicon wafer. The spin speed was 5000 RPM and the duration was 30 seconds. The final coating thickness was 3300 angstroms.

The wafer was then prebaked as in Example 1. After the prebake, the wafer was exposed using vacuum contact lithography as described in Example 1. Exposure doses and post bake times were varied for sixteen different wafers as indicated in Table I below. The post bakes were conducted as in Example 1.

The wafers were immersion developed for 20 seconds in a developer composed of 0.01 M mixture of sulfuric acid in deionized water. They were rinsed for 10 seconds in ethanol. Patterns having line sizes down to 2 microns were observed. The resist again performed as a negative photoresist. The dependence of the remaining thickness (in angstroms) on exposure dose and post bake time is shown in Table I:

TABLE I

| Exposure Dose | Post Bake Time (minutes) | | | |
|---|---|---|---|---|
| (mJ/cm$^2$) | 1.5 | 3 | 6 | 12 |
| 25 | 0 | 0 | 0 | 1200 |
| 50 | 900 | 1100 | 1300 | 1800 |
| 100 | 1400 | 1600 | 1800 | 1800 |
| 200 | 1900 | 1900 | 1900 | 1900 |

The wafers were then placed in an oxygen plasma. The resist lines survived the oxygen plasma, indicating that this resist composition could be useful for pattern transfer as in Example 1.

EXAMPLE 8

The PVA solution was prepared as in Example 7. To 5 ml of this solution, 1 ml of 1 M perchloric acid in deionized water was added. To this mixture was added 0.552 g of ammonium diphosphotungstate [$(NH_4)_6P_2W_{18}O_{62} \cdot xH_2O$, FW 4471.44]. This mixture served as the photoresist.

Wafers were spin coated with this resist as was done in Example 7; the final coating thickness was 2500 angstroms. The wafers were prebaked, exposed, post baked, and developed as done in Example 7. Patterns having feature sizes down to 2 microns were observed after developing. The effect of exposure dose and post bake time on remaining thickness (in angstroms) after developing is shown in Table II:

TABLE II

| Exposure Dose | Post Bake Time (minutes) | | | |
|---|---|---|---|---|
| (mJ/cm$^2$) | 1.5 | 3 | 6 | 12 |
| 25 | 0 | 0 | 0 | 200 |
| 50 | 400 | 350 | 500 | 900 |
| 100 | 600 | 700 | 750 | 850 |
| 200 | 850 | 1100 | 1150 | 1250 |

As in Example 7, the patterns withstood an oxygen plasma, indicating that the material could be used for pattern transfer as in Example 1.

EXAMPLE 9

6.0 g of 88% hydrolyzed PVA, 25,000 nominal MW, was added to a 250 ml Erlenmeyer flask containing 100 ml of deionized water (resistivity=17.8 megaohm-cm). The solution was stirred constantly and heated slowly up to a temperature of 75° C. The polymer was completely dissolved in a 30 min. total heating time. Then the solution was removed from heat and allowed to cool to room temperature. The final solution volume was approximately 102 ml. To 50 ml of this solution, 7.2 g of phosphotungstic acid was added and dissolved. This solution served as the photoresist.

A layer of the photoresist was spin coated on a silicon wafer at 5000 RPM for 30 seconds. The thickness of this layer was 2000 angstroms.

Wafers prepared in this matter were prebaked for 10 minutes on top of an insulator in a 69° C. oven, exposed as in Example 1, postbaked for 17 minutes on a metal surface in the 68° C. oven and developed as in Example 2.

Patterns were formed on the surface of the wafer as in the previous examples (negative photoresist). The dependence of the remaining thickness on exposure dose is given in Table III:

TABLE III

| Exposure Dose (mJ/cm$^2$) | Remaining Thickness (in angstroms) |
|---|---|
| 0 | 0 |
| 10 | 650 |
| 15 | 800 |
| 20 | 1100 |
| 30 | 1200 |
| 40 | 1300 |

EXAMPLE 10

0.35 g of poly(2-hydroxyethyl methacrylate), purchased from Aldrich Chemical Co., was dissolved with stirring in 10 ml of 2-ethoxyethanol. 1.44 g of phosphotungstic acid was then dissolved in this solution. The resulting solution served as the photoresist.

A layer of the photoresist was spin coated at 5000 RPM for 30 seconds on a silicon wafer having a surface layer of silicon dioxide. The wafer was then prebaked on a metal surface in a 58° C. oven for 20 minutes. Selected areas of this wafer were exposed with a low pressure mercury lamp at doses of 15, 30, 60, 120 and 180 mJ/cm$^2$. The wafer was immersed and constantly agitated in an aqueous solution of sulfuric acid (pH 1.6) for 2 minutes, rinsed with water and blown air dry with a jet of air.

The photoresist layer was preferentially dissolved at the exposed in comparison to the unexposed areas for all the used exposure doses (positive photoresist). The thickness of the photoresist layer at the unexposed areas was approximately 1500 angstroms. The dose of 180 mJ/cm$^2$ was almost enough to dissolve the whole photoresist layer (a very thin layer of about 100 angstroms remained).

EXAMPLE 11

Figure 6:
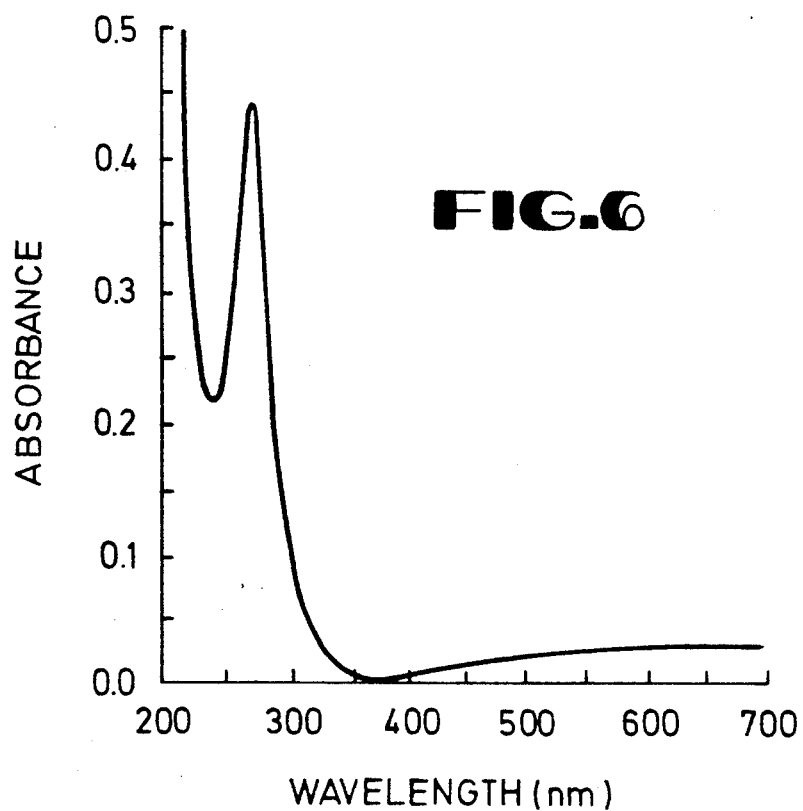
FIG. 6 is a plot showing the absorption spectrum of a resist containing phosphotungstic acid and polyvinyl alcohol.

FIG. 6 shows the absorption spectrum of a preferred resist containing phosphotungstic acid and PVA from the deep UV through the visible. The absorbance of this resist at 248 nm is approximately 0.245. The absorption of the resist is believed to be almost entirely due to the polyoxometalate, since the PVA is essentially transparent at 248 nm and longer wavelengths.

EXAMPLE 12

Figure 7:
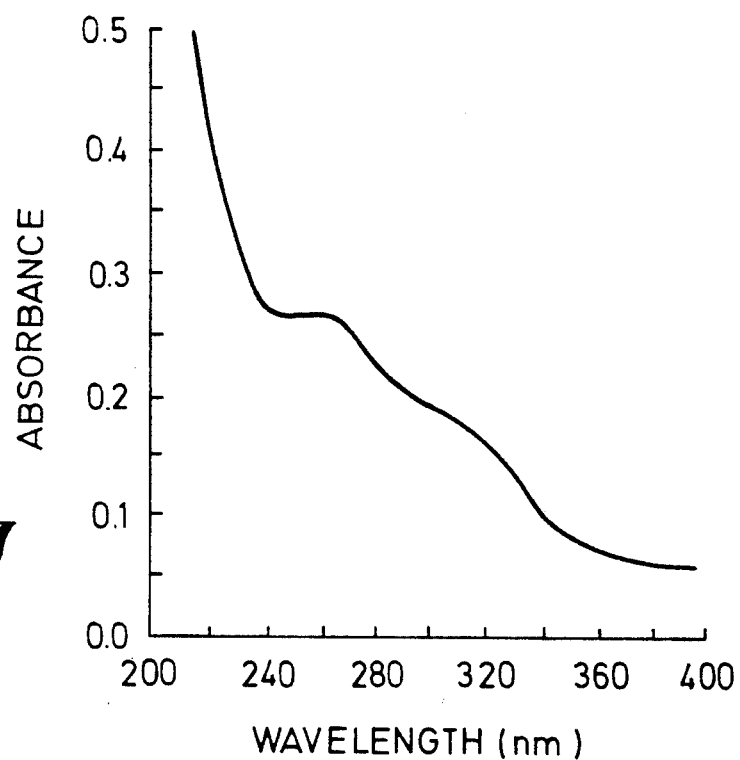
FIG. 7 is a plot showing the absorption spectrum of a resist containing phosphotungstic acid and ammonium diphosphotungstate [$(NH_4)_6P_2W_{18}O_{62}$].

FIG. 7 shows the absorption spectrum of a comparable resist containing a mixture of phosphotungstic acid and ammonium diphosphotungstate $(NH_3)_6P_2W_{18}O_{62}$ as the photoactive compound. As can be seen, the spectral linearity for this resist was very good, essentially zero throughout the broad band range of 248±10 nm.

Figure 8:
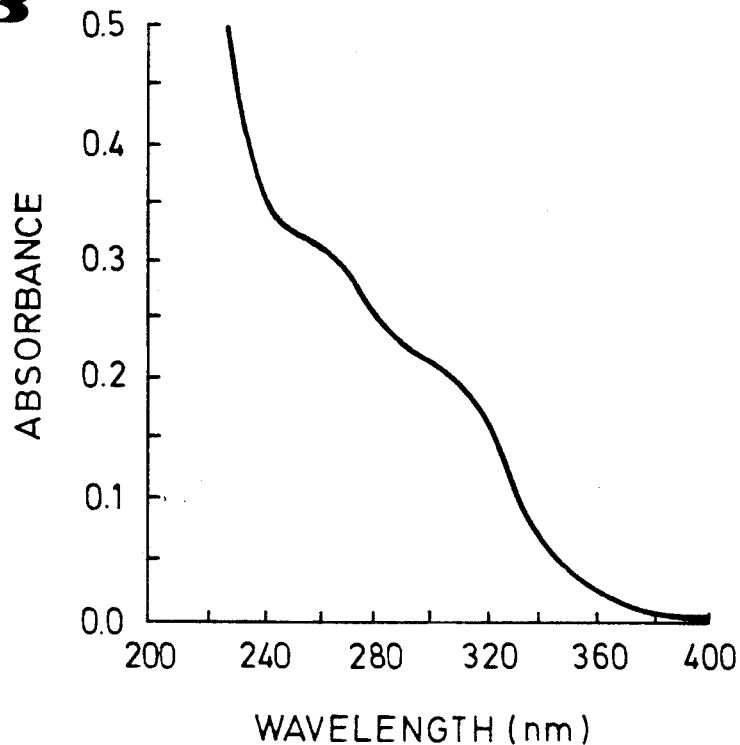
FIG. 8 is a plot showing the absorption spectrum of a resist containing ammonium diphosphotungstate.

FIG. 8 shows the absorption spectrum of a resist containing ammonium diphosphotungstate only as the photosensitizer. This resist gave good results with sensitivity and resolution that were comparable to the resist containing phosphotungstic acid. Although there are straightforward procedures for the production of this material, it is not available commercially.

EXAMPLE 13

FIG. 9 shows film thicknesses obtained by spinning the phosphotungstic acid/PVA resist solution of Example 1 at various spin speeds. The resist solution had a viscosity of about 3 cp, and the films were spun for approximately 30 seconds each. As can be seen, spinning at 4000 RPM resulted in a uniform coating having about 1100 angstroms thickness. The curve sloped sharply up at lower RPM speeds, producing a film thickness of about 2000 anstroms at 1000 RPM. At higher speeds, the curve sloped gradually downward, giving a thickness of 800 angstroms at 7000 RPM.

This invention has been disclosed in connection with specific embodiments. However, it will be apparent to those skilled in the art that variations from the illustrated embodiments may be undertaken without departing the spirit and scope of the invention.

What is claimed is:

1. A process for transferring a pattern from a layer of radiation sensitive material into an underlying second material, comprising the steps of:
   establishing a layer of radiation sensitive material on a second material, the radiation sensitive material comprising a mixture of an organic compound and a polyoxometalate;
   forming a pattern in the layer of radiation sensitive material by exposing selected areas of said layer to radiation; and
   transferring the pattern into the underlying second material.

2. The process of claim 1, wherein the organic compound comprises a polymer.

3. The process of claim 2, wherein the polymer includes a plurality of hydroxyl groups.

4. The process of claim 2, wherein the polymer includes a plurality of amide groups.

5. The process of claim 1, wherein the polyoxometalate includes metal atoms selected from one or more of the following metals: tungsten, molybdenum, niobium, vanadium, and tantalum.

6. The process of claim 1, wherein the polyoxometalate comprises a heteropolyoxometalate.

7. The process of claim 6, wherein the heteropolyoxometalate includes heteroatoms selected from the group of phosphorus, silicon, germanium, cobalt, hydrogen, iron, arsenic, and boron.

8. The process of claim 6, wherein the heteropolyoxometalate molecules have a ratio of heteroatoms:metal (addenda) atoms of 1:6, 1:9, 1:11, 1:12, 2:17, 2:18, 2:19, or 2:21.

9. The process of claim 1, wherein the polyoxometalate comprises an isopolyoxometalate.

10. The process of claim 1, wherein the polyoxometalate molecules have between about 6 and 18 metal (addenda) atoms.

11. The process of claim 1, wherein the layer establishing step comprises spin coating a solution containing the radiation sensitive material onto the second material.

12. The process of claim 11, wherein the solvent comprises water.

13. The process of claim 1, further comprising the step of developing the pattern in the layer of radiation sensitive material prior to the transferring step.

14. The process of claim 13, wherein the pattern developing step comprises removing the exposed areas of the layer of radiation sensitive material.

15. The process of claim 14, wherein the exposed areas of the layer of radiation sensitive material are removed by dissolving said areas in aqueous sulfuric acid.

16. The process of claim 14, further comprising the step of heating the layer of radiation sensitive material prior to the developing step under such conditions to increase the solubility of the exposed areas of radiation sensitive material, or to decrease the solubility of the unexposed areas of radiation sensitive material.

17. The process of claim 13, wherein the pattern developing step comprises removing the unexposed areas of the layer of radiation sensitive material.

18. The process of claim 17, wherein the unexposed areas of the layer of radiation sensitive material are removed by dissolving said areas in aqueous phosphoric acid.

19. The process of claim 17, further comprising the step of heating the layer of radiation sensitive material prior to the developing step under such conditions to decrease the solubility of the exposed areas of radiation sensitive material, or to increase the solubility of the unexposed areas of radiation sensitive material.

20. The process of claim 13, wherein the pattern developing step comprises dissolving either the exposed or the unexposed areas of radiation sensitive material in an aqueous solution of a polyoxometalate.

21. The process of claim 20, wherein the polyoxometalate in the solvent is the same as the polyoxometalate in the radiation sensitive material.

22. The process of claim 13, wherein either the exposed or unexposed areas of radiation sensitive material are removed by dissolving said areas in a solvent having a sufficiently high electrolyte concentration such that the undissolved areas of the radiation sensitive material substantially do not swell in the solvent.

23. The process of claim 13, wherein the pattern transferring step comprises implanting ions into uncovered areas of the second material.

24. The process of claim 1, wherein the pattern transferring step comprises etching the second material with an ionized gas, the radiation sensitive material being etch resistant to the ionized gas.

25. The process of claim 24, wherein the gas molecules are directed anisotropically in an electric field.

26. The process of claim 24 or 25, wherein the gas comprises oxygen.

27. The process of claim 24 or 25, wherein the gas comprises a halogen containing gas.

28. The process of claim 27, wherein the halogen containing gas comprises a fluorine containing gas.

29. The process of claim 1, wherein the pattern transferring step comprises etching the second material with a solvent, the radiation sensitive material being etch resistant to the solvent.

30. The process of claim 1, further comprising the step of stripping the layer of radiation sensitive material.

31. The process of claim 30, wherein the layer stripping step comprises etching the radiation sensitive material with an ionized gas.

32. The process of claim 31, wherein the gas comprises oxygen and a halogen containing gas.

33. A process for transferring a pattern from a layer of radiation sensitive material into underlying layers of materials, comprising the steps of:
   establishing a layer of first material on a second material;

establishing a layer of radiation sensitive material on the layer of first material, the radiation sensitive material comprising a mixture of an organic compound and a polyoxometalate;

forming a pattern in the layer of radiation sensitive material by exposing selected areas of said layer to radiation;

transferring the pattern into the underlying layer of first material; and transferring the pattern into the underlying second material.

34. The process of claim 33, wherein the first pattern transferring step comprises etching the first material with an ionized gas, the radiation sensitive material being etch resistant to the ionized gas.

35. The process of claim 33, wherein the organic compound in the radiation sensitive material is stripped during the first pattern transferring step.

36. The process of claim 33, wherein the second pattern transferring step comprises etching the second material with an ionized gas, the first material being etch resistant to the ionized gas.

37. The process of claim 33, wherein the polyoxometalate in the radiation sensitive material is stripped during the second pattern transferring step.

38. A process for transferring a pattern from a layer of a first radiation sensitive material into a second radiation sensitive material, comprising the steps of:

establishing a layer of a first radiation sensitive material on a radiation transparent material, the first radiation sensitive material comprising a mixture of an organic compound and a polyoxometalate;

photolithographically forming a pattern in the layer of first radiation sensitive material;

reducing the polyoxometalate such that the patterned first radiation sensitive material becomes opaque to radiation; and transferring the pattern into a second radiation sensitive material by irradiating the second radiation sensitive material through the opaque pattern.

39. The process of claim 38, further comprising the step of oxidizing the organic compound prior to the pattern transferring step.

40. A process for making a mask for use in transferring a pattern by radiation, comprising the steps of:

establishing a layer of radiation sensitive material on a radiation transparent material, the radiation sensitive material comprising a mixture of an organic compound and a polyoxometalate;

forming a pattern in the layer of radiation sensitive material by exposing selected areas of said layer to radiation;

removing either the exposed or the unexposed areas of the layer of radiation sensitive material; and reducing the polyoxometalate in the remaining areas of the layer of radiation sensitive material such that said material becomes opaque to radiation.

41. The process of claim 40, further comprising the step of oxidizing the organic compound.

42. The process of claim 38 or 40, wherein the polyoxometalate is reduced in the reducing step such that the pattern becomes metallic.

43. A microlithographic process for transferring a pattern into a substrate, comprising:

establishing a resist layer on a substrate, the resist comprising a mixture of an organic compound and a polyoxometalate;

forming a pattern in the resist layer by exposing selected areas of the resist layer to radiation;

developing the pattern in the resist layer; and transferring the pattern into the substrate.

44. The process of claim 43, wherein the pattern transferring step comprises implanting ions into uncovered areas of the substrate.

45. The process of claim 43, wherein the pattern transferring step comprises etching the pattern into the substrate.

46. The process of claim 45, wherein the substrate is etched with a solvent, the radiation sensitive material being etch resistant to the solvent.

47. The process of claim 46, wherein the solvent comprises aqueous HCl, HF, or $H_3PO_4$.

48. The process of claim 45, wherein the substrate is etched with an ionized gas, the organic compound being etch resistant to the gas.

49. The process of claim 48, wherein the gas comprises a halogen containing gas.

50. The process of claim 49, wherein the halogen containing gas comprises a fluorine containing gas.

51. The process of claim 44, wherein the resist layer establishing step comprises spin coating a solution containing the resist onto the substrate.

52. A microlithographic process for etching a pattern into a substrate, comprising:

establishing a layer of organic material on a substrate;

establishing a resist layer on the layer of organic material, the resist comprising a mixture of an organic compound and a polyoxometalate;

forming a pattern in the resist layer by exposing selected areas of the resist layer to radiation;

developing the pattern in the resist layer;

etching the pattern into the layer of organic material; and etching the pattern into the substrate.

53. The process of claim 52, wherein the first etching step comprises etching the layer of organic material with a first ionized gas, the polyoxometalate being etch resistant to the first ionized gas, and the second etching step comprises etching the substrate with a second ionized gas, the organic material being etch resistant to the second ionized gas.

54. The process of claim 48 or 53, wherein the gas molecules are directed anisotropically in an electric field.

55. The process of claim 53, wherein the first ionized gas comprises oxygen.

56. The process of claim 53, wherein the second ionized gas comprises a halogen containing gas.

57. The process of claim 56, wherein the halogen containing gas comprises a fluorine containing gas.

58. The process of claim 52, wherein the resist layer establishing step comprises spin coating a solution containing the resist onto the layer of organic material.

59. The process of claim 51 or 58, wherein the solvent comprises water.

60. The process of claim 43 or 52 wherein the organic compound comprises a polymer.

61. The process of claim 43 or 52, wherein the polyoxometalate includes metal atoms selected from one or more of the following metals: tungsten, molybdenum, niobium, vanadium and tantalum.

62. The process of claim 43 or 52, wherein the pattern developing step comprises removing the exposed areas of the resist layer.

63. The process of claim 62, wherein the exposed areas of the resist layer are removed by dissolving said areas in aqueous sulfuric acid.

64. The process of claim 62, further comprising the step of heating the resist layer prior to the developing step under such conditions to increase the solubility of the exposed areas of the resist layer or to decrease the solubility of the unexposed areas of the resist layer.

65. The process of claim 43 or 52, wherein the pattern developing step comprises removing the unexposed areas of the layer of radiation sensitive material.

66. The process of claim 65, wherein the unexposed areas of the resist layer are removed by dissolving said areas in aqueous phosphoric acid.

67. The process of claim 65, further comprising the step of heating the resist layer prior to the developing step under such conditions to decrease the solubility of the exposed areas of the resist layer or to increase the solubility of unexposed areas of the resist layer.

68. The process of claim 43 or 52, wherein the pattern developing step comprises dissolving either the exposed or the unexposed areas of the resist layer in an aqueous solution of a polyoxometalate.

69. The process of claim 68, wherein the polyoxometalate in the solvent is the same as the polyoxometalate in the resist.

70. The process of claim 43 or 52, wherein the exposed or unexposed areas of the resist layer are removed by dissolving said areas in a solvent having a sufficiently high ionic strength such that the undissolved areas of the resist layer substantially do not swell in the solvent.

71. A method for developing a layer of radiation sensitive material containing an etch resistant substance, said etch resistant substance comprising a polyoxometalate, in such a manner so as to hinder leaching of the etch resistant substance, the layer of radiation sensitive material including areas which have been exposed to radiation, the method comprising dissolving either the exposed areas or the unexposed areas of radiation sensitive material in a solution containing the etch resistant substance.

72. The method of claim 71, wherein the solution of etch resistant substance has a sufficiently high electrolyte concentration such that the areas of the radiation sensitive material which are not dissolved in the solution substantially do not swell in the solution.

73. A method for developing a layer or radiation sensitive material containing an etch resistance substance, said etch resistant substance comprising a polyoxometalate, in such a manner so as to hinder leaching of the etch resistant substance, the layer of radiation sensitive material including areas which have been exposed to radiation, the method comprising dissolving either the exposed areas or the unexposed areas of radiation sensitive material in a solvent having a sufficiently high electrolyte concentration such that the undissolved areas of radiation sensitive material substantially do not swell in the solvent.

74. A process for forming an electrically conducting pattern on a surface, comprising the steps of:
   establishing a layer of radiation sensitive material on a surface, the radiation sensitive material comprising a mixture of an organic compound and a polyoxometalate;
   photolithographically forming a pattern in the layer of first radiation sensitive material; and
   oxidizing the organic compound and reducing the polyoxometalate such that the patterned layer becomes electrically conducting.

75. The process of claim 74, further comprising the step of establishing a layer of metal on the electrically conducting pattern.

76. The process of claim 74, wherein the surface comprises polycrystalline silicon.

77. The process of claim 75, wherein the layer of metal comprises aluminum.

* * * * *

UNITED STATES PATENT AND TRADEMARK OFFICE
CERTIFICATE OF CORRECTION

PATENT NO.   :   5,178,989

DATED        :   January 12, 1993

INVENTOR(S)  :   Heller et al.

It is certified that error appears in the above-identified patent and that said Letters Patent is hereby corrected as shown below:

In claim 73, at column 30, line 9, change "or" to --of--.

Signed and Sealed this

Second Day of November, 1993

Attest:

BRUCE LEHMAN

Attesting Officer    Commissioner of Patents and Trademarks